United States Patent [19]
Marsland et al.

[11] Patent Number: 5,378,939
[45] Date of Patent: Jan. 3, 1995

[54] GALLIUM ARSENIDE MONOLITHICALLY INTEGRATED SAMPLING HEAD USING EQUIVALENT TIME SAMPLING HAVING A BANDWIDTH GREATER THAN 100 GHZ

[75] Inventors: Robert A. Marsland, Stanford; Mark Rodwell, Goleta; David M. Bloom, Portola Valley, all of Calif.

[73] Assignee: The Board of Trustees of The Leland Stanford Junior University, Stanford, Calif.

[21] Appl. No.: 686,916

[22] Filed: Apr. 16, 1991

Related U.S. Application Data

[63] Continuation-in-part of Ser. No. 558,356, Jul. 26, 1990, abandoned, which is a continuation-in-part of Ser. No. 259,027, Oct. 17, 1988, Pat. No. 5,267,020, which is a continuation-in-part of Ser. No. 106,554, Oct. 6, 1987, Pat. No. 5,014,018.

[51] Int. Cl.$^6$ ...................... H03K 17/60; H03K 17/00
[52] U.S. Cl. ..................................... 307/352; 307/353; 307/263; 328/151; 330/20
[58] Field of Search ............ 307/352, 259, 263, 317.2, 307/320, 256, 353; 328/151; 333/20

[56] References Cited

U.S. PATENT DOCUMENTS

| | | | |
|---|---|---|---|
| 3,596,191 | 7/1971 | Stuckert | 307/353 |
| 3,760,283 | 9/1993 | Lockwood | 333/20 |
| 3,909,751 | 9/1975 | Tang et al. | |
| 4,075,650 | 2/1978 | Calviello | |
| 4,097,890 | 6/1978 | Morris et al. | |
| 4,460,880 | 7/1984 | Turner | |
| 4,594,557 | 6/1986 | Shillady | |
| 4,654,600 | 3/1987 | Lockwood | |
| 4,672,341 | 6/1987 | Axell | |
| 4,745,445 | 5/1988 | Mun et al. | |
| 4,837,532 | 6/1989 | Lang | |
| 4,855,696 | 8/1989 | Tan et al. | |
| 4,956,568 | 9/1990 | Su et al. | 307/352 |
| 5,023,574 | 6/1991 | Anklam et al. | |

FOREIGN PATENT DOCUMENTS 0081414 6/1983 France .
2837283 12/1979 Germany .
2950644 6/1981 Germany .

OTHER PUBLICATIONS

J. W. Archer & M. T. Faber, "High- Output, Single- and Dual-Diode, Millimeter-Wave Frequency Doublers", *IEEE Transactions on Microwave Theory & Techniques*, MTT-33, No. 6, Jun. 1985, pp. 533-538.

Y. Ayasli, et al., "A Monolithic GaAs 1-13 GHz Travelling-Wave Amplifier", *IEEE Transactions on Microwave Theory & Techniques*, vol. MTT-30, No. 7, Jul. 1982, pp. 976-981.

I. J. Bahl, et al., "GaAs IC's Fabricated with the High-Performance, High-Yield Multi-function Self-Aligned Gate Process for Radar and EW Applicatons", *IEEE Transactions on Microwave Theory & Techniques*, vol. MTT-38, No. 9, Sep. 1990, pp. 1232-1241.

I. J. Bahl, et al., "Multification SAG Process for High-Yield, Low-Cost GaAs Microwave Integrated Circuits", *IEEE Transactions on Microwave Theory & Techniques*, vol. 38, No. 9, Sep. 1990, pp. 1175-1182.

E. M. Bastida, et al., "Periodic Slow-Wave Low-Loss Structuring for Monolithic GaAs Microwave Integrated Circuits", *Electronics Letters*, vol. 15, No. 9, Sep. 13, 1979, pp. 581-582.

(List continued on next page.)

Primary Examiner—Timothy P. Callaham
Attorney, Agent, or Firm—Claude A. S. Hamrick

[57] ABSTRACT

A high bandwidth RF sampler using equivalent time sampling comprising an RF coplanar waveguide integrated with sampling diodes on a gallium arsenide substrate. A monolithic, integrated coplanar strip nonlinear transmission line is integrated on the same substrate to receive sample pulses. These pulses are reshaped by the nonlinear transmission line to have a very fast edge. This edge is differentiated by a shunt inductance of a short circuit termination of a slot line portion of the RF signal coplanar waveguide. The resulting delta function sample pulses cause the sample diodes and integrated capacitors to develop an intermediate output frequency which is a replica of the RF signal at a lower frequency and no voltage conversion loss. RF signals of up to 300 Ghz can be sampled using this circuit.

9 Claims, 17 Drawing Sheets

OTHER PUBLICATIONS

M. Birk & Q. A. Kerns, "Varactor Transmission Lines", Engineering note number EE-922, May 22, 1963, Lawrence Radiation Laboratory, University of California, Berkeley.

G. E. Brehm. et al., "High Capacitance Ratio Monolithic Varactor Diode", Proc. Eighth Biennial Cornell Elec. Eng. Conf. Aug. 11–13, 1981, pp. 53–63.

R. H. Freeman & A. E. Karbowiak, "An Investigation of Nonlinear Transmission Lines and Shock Waves", *Journal of Physics*, D: Applied Physics, vol. 10, pp. 633–643, 1977.

Y. Fukuoka & T. Itoh, "Slow-Wave Coplanar Waveguide on Periodically Doped Semiconductor Substrate", *IEEE Transactions on Microwave Theory and Techniques*, vol. MTT-31, No. 12, Dec. 1983, pp. 1013–1017.

Y. Fukuoka & T. Itoh, "Design Consideration of Uniform and Periodic Coplanar Schottky Variable Phase Shifter", pp. 278–282. Publication, Date unknown.

Y. Fukuoka, Y.-C. Shih, T. Itoh, "Analysis of Slow-Wave Coplanar Waveguide for Monolithic Integrated Circuits", *IEEE Transactions on Microwave Theory and Techniques*, vol. MTT-31, No. 7, Jul. 1983. pp. 567–573.

A. E. Geissberger, et al. "A New Refractory Self-Aligned Gate Technology for GaAs Microwave Power FET's and MMIC's", *IEEE Transactions on Electron Devices*, vol. 35, No. 5, May 1988, pp. 615–622.

S. R. Gibson, "Gallium Arsenide Lowers Cost and Improves Performance of Microwave Counters", *Hewlett-Packard Journal* 37(2):4–10, Feb. 1986.

W. M. Grove, "A DC to 12.4 GHz Feedthrough Sampler for Oscilloscopes and Other RF Systems", *IEEE Transactions on Microwave Theory and Techniques*, vol. MTT-14, No. 12, Dec. 1966, pp. 12–15.

U. Gunther & E. Voges, "Variable Capacitance MIS Microstrip Lines", *A.E.C.*, Band 27, Heft 3, 1973, pp. 131–139.

H. Hasegawa & H. Okizaki, "M.I.S. and Schottky Slow-Wave CoPlanar Strip-lines on GaAs Substrates", *Electronics Letters*, vol. 13, No. 22, Oct. 27, 1977, pp. 663–664.

G. Hasnain, A. Dienes, J. R. Whinnery, "Dispersion of Picosecond Pulses in Coplanar Transmission Lines", *IEEE Transactions on Microwave Theory and Techniques*, vol. MTT-34, No. 6, Jun. 1986, pp. 738–741.

R. Hirota & K. Suzuki, "Theoretical and Experimental Studies of Lattice Solitons in Nonlinear Lumped Networks", *IEEE Proc.*, vol. 61, No. 10, Oct., 1973, pp. 1483–1491.

D. Howard, et al., "The Wideband Sampling Gate – An Analysis, Characterization and Application Discussion", Hewlett-Packard Publication, pp. 1–11.

G. W. Hughes & R. M. White, "Microwave Properties of Nonlinear MIS and Schottky-Barrier Microstrip", *IEEE Transactions on Electron Devices*, vol. ED-22, No. 10, Oct. 1975, pp. 945–956.

J. M. Jaffe, "A High-Frequency Variable Delay Line", *IEEE Transactions on Electron Devices*, Dec. 1972, pp. 1292–1294.

D. Jäger & F. J. Tegude, "Nonlinear Wave Propagation Along Periodic-Loaded Transmission Line", *Applied Physics* 15, pp. 393–397 (1978).

D. Jäger, "Experiments on KdV Solitons", *Journal of the Physical Society of Japan*, vol. 51, No. 5, May 1982, pp. 1686–1693.

D. Jäger, W. Rabus, W. Eickhoff, "Bias-Dependent Small-Signal Parameters of Schottky Contact Microstrip Lines", *Solid-State Electronics*, vol. 17, 1974, pp. 777–783.

D. Jäger, "Soliton Propagation along Periodic-Loaded Transmission Line", *Appl. Phys.*, vol. 16, 1978, pp. 35–38.

D. Jäger & J. P. Becker, "Distributed Variable-Capacitance Microstrip Lines for Microwave Applications", *Appl. Phys.*, vol. 12, 1977, pp. 203–207.

D. Jäger, "Slow-Wave Propagation Along Variable Schottky-Contact Microstrip Line", *IEEE Transactions on Microwave Theory and Techniques*, vol. MTT-24, No. 9, Sep. 1976, pp. 566–573.

D. Jäger, "Characteristics of travelling waves along the non-linear transmission lines for monolithic integrated circuits: a review", *Int. J. Electronics*, 1985, vol. 58, No. 4, pp. 649–669.

D. Jäger & W. Rabus, "Bias-Dependent Phase Delay of Schottky Contact Microstrip Line", *Electronics Letters*, vol. 9, No. 10, May 17, 1973, pp. 201–203.

M. B. Ketchen, et al., "Generation of subpicosecond electrical pulses on coplanar transmission lines", *Appl. Phys. Lett.*, vol. 48, No. 12, Mar. 24, 1986, pp. 751–753.

R. V. Khokhlov, "On the Theory of Shock Radio Waves In Non-Linear Lines", *Radiotekhnika i elektronika* 6(6):77–89, 1971.

R. Landauer, "Parametric Amplification Along Nonlin- (List continued on next page.)

OTHER PUBLICATIONS ear Transmission Lines", *Journal of Applied Physics*, vol. 31, No. 3, Mar. 1960, pp. 479-484.

R. Landauer, "Shock Waves in Nonlinear Transmission Lines and Their Effect on Parametric Amplification", *IBM Journal*, Oct. 1960, pp. 391-401.

E. Lüder, "Delay lines comprising non-linear capacitances", received Mar. 22, 1968, published Oct. 1968 in *Archiv der Elektrischen Ubertragung*, Band 22, Heft 10, Seiten 461-508.

C. J. Madden, et al,. "Generation of 3,5-ps Fall-Time Shock Waves on a Monolithic GaAs Nonlinear Transmission Line", *IEEE Electron Device Letters*, vol. 9, No. 6, Jun. 1988. p. 304.

C. J. Madden, et al., "Hyperabrupt-doped GaAs non-linear transmission line for picosecond shock-wave generation", *Appl. Phys. Lett.* 54 (11), 13 Mar. 1989, pp. 1019-1021.

R. Majidi-Ahy & D. M. Bloom, "Millimetre-Wave Active Probe Frequency-Multiplier for On-Wafer Characterization of GaAs Devices and ICs", *Electronics Letters*, 5th Jan. 1989, vol. 25, No. 1, pp. 6-8.

R. A. Marsland, et al., "Picosecond Pulse Generation and Sampling With GaAs Monolithic Integrated Circuits", Paper delivered at the Picosecond Electronics and Optoelectronics Meeting of the Optical Society of America, Salt Lake City, Utah, Mar. 8-10, 1989 p. 99.

R. A. Marsland, et al., "100 Ghz GaAs MMIC Sampling Head", *IEDM*, Dec. 14, 1988.

J. Merkelo and R. D. Hall, "Broad-band Thin-Film Signal Sampler", *IEEE Journal of Solid-State Circuits*, vol. SC-7, No. 1, Feb. 1972, pp. 50-54.

J. Merkelo, "A dc-to-20-GHz Thin-film Signal Sampler for Microwave Instrumentation", *Hewlett-Packard Journal*, Apr. 1973, pp. 10-13.

S. Moore, et al., "Microwave Sampling Effective for Ultrabroadband Frequency Conversion", MSN & CT, Feb. 1986, pp. 113-126.

R. S. Pengelly, "Microwave Field-Effect Transistors-Theory, Design and Applications", Research Studies Press. p. 420.

J. Perini, "Periodically Loaded Transmission Lines", *IEEE Transactions on Microwave Theory and Techniques*, vol. MTT-28, No. 9, Sep. 1980, pp. 1029-1031.

R. A. Pucel, "Design Considerations for Monolithic Microwave Circuits", *IEEE Transactions on Microwave Theory and Techniques*, vol. MTT-29, No. 6, Jun. 1981, pp. 513-534.

W. Rabus, "Über die Frequenzvervielfachung Längs Schottky-Kontakt-Leitungen", *A.E.U.*, Band 28, Heft 1, Jan. 1974.

R. B. Riley, "An Analysis Of A Nonlinear Transmission Line", Technical Report No. 1707-1, Stanford Electronics Laboratories, Jan. 20, 1961, pp. 1-61.

M. Rodwell, et al., "Nonlinear Transmission Line for Picosecond Pulse Compression and Broadband Phase Modulation", *Electronics Letters*, vol. 23, No. 3, Jan. 29, 1987, pp. 109-110.

M. Rodwell, et al., "Gate Porpagation Delay and Logic Timing of GaAs Integrated Circuits Measured by Electro-Optic Sampling", *Electronics Letters*, vol. 22, No. 9, Feb. 24, 1986, pp. 499-500.

R. A. Sadler. et al., "A Buried p-Layer Self-Aligned Process for High-Yield LSI Circuits", ITT Gallium Arsenide Technology Center.

A. C. Scott, F. Y. F. Chu, D. W. McLaughlin, "The Soliton: A New Concept in Applied Science", *Proc, IEEE*, vol. 61, No. 10, Oct. 1973, pp. 1443-1482.

S. Seki & H. Hasegawa, "Cross-Tie Slow-Wave Coplanar Waveguide on Semi-insulating GaAs Substrates", *Electronics Letters*, vol. 17, No. 25, Dec. 10, 1981, pp. 940-941.

Y. Shih & T. Itoh, "Analysis of Printed Transmission Lines for Monolithic Integrated Circuits", *Electronics Letters*, vol. 18, No. 14, Jul. 8, 1982, pp. 585-586.

E. W. Strid & K. R. Gleason, "A DC-12 GHz Monolithic GaAsFET Distributed Amplifier", *IEEE Transactions on Microwave Theory and Techniques*, vol. MTT-30, No. 7, Jul. 1982, pp. 969-975.

K. J. Weingarten et al., "Picosecond Optical Sampling of GaAs Integrated Circuits", invited paper to *IEEE Journal of Quantun Electronics on Ultrafast Optics and Electronics*, pub. Feb. 1988 Stanford University. pp. 1-27.

R. L. Wigington & N. S. Nahman, "Transient Analysis of Coaxial Cables Considering Skin Effect", *Proceedings of the IRE*, Feb. 1957, pp. 166-174.

P. Wolf, "Picosecond Sampling with Josephson Junctions", Springer Series in Electrophysics, vol. 21, pp. 236-243.

P. Kennis, et al., "Properties of Microstrip and Coplanar Lines on Semiconductor Substrate", *Proc. 12th Eur. Conf.*, Sep. 1982, pp. 328-333.

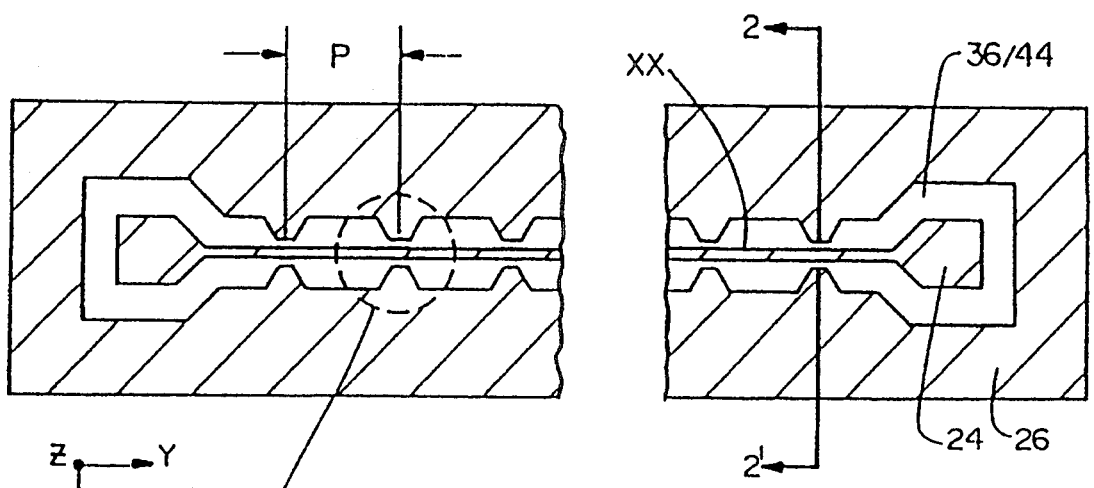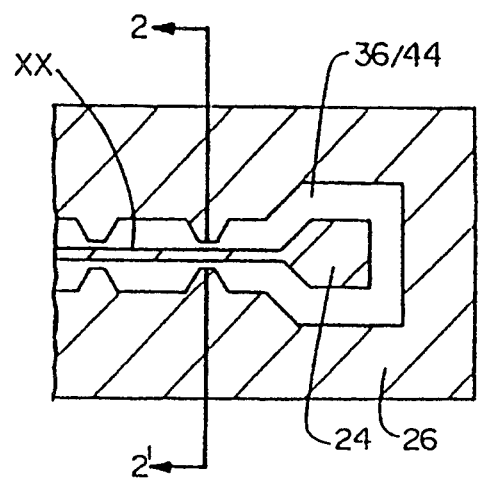
FIG. 12
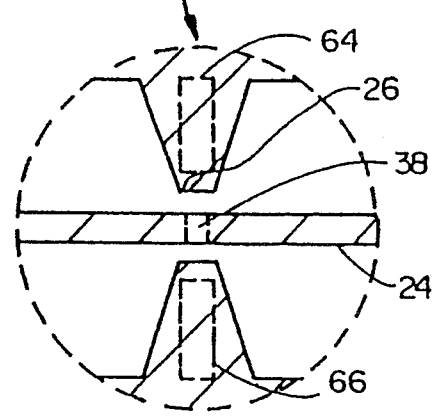
FIG. 14
FIG. 13

GALLIUM ARSENIDE MONOLITHICALLY INTEGRATED SAMPLING HEAD USING EQUIVALENT TIME SAMPLING HAVING A BANDWIDTH GREATER THAN 100 GHZ

BACKGROUND OF THE INVENTION

This work was funded by the United States Government's Office of Naval Research under Contract No. N99914-85-K-0381. The United States Government has a paid up license to practice this technology.

This is a continuation-in-part of a United States patent application entitled, "INTEGRATED COPLANAR STRIP NONLINEAR TRANSMISSION LINE SAMPLING HEAD USING EQUIVALENT TIME SAMPLING HAVING A BANDWIDTH GREATER THAN 100 GHZ", by Marsland, Rodwell and Bloom, filed Jul. 26, 1990, Ser. No. 07/558,356, which was a continuation-in-part of a United States patent application entitled, "GALLIUM ARSENIDE MONOLITHICALLY INTEGRATED SAMPLING HEAD USING EQUIVALENT TIME SAMPLING HAVING A BANDWIDTH GREATER THAN 100 GHZ", filed Oct. 17, 1988, Ser. No. 07/259,027, by Marsland, Bloom and Rodwell, now U.S. Pat. No. 5,267,020, which was a continuation-in-part of a United States patent application entitled, "NONLINEAR TRANSMISSION LINE FOR GENERATION OF PICOSECOND ELECTRICAL TRANSIENTS", Ser. No. 106,554, filed Oct. 6, 1987, now U.S. Pat. No. 5,014,018, by Bloom and Rodwell, all of which are currently copending and which are incorporated herein by reference.

The invention pertains to the field of sampling very high frequency RF signals. More specifically, the invention relates to an integrated sample head which uses equivalent time sampling for generation of an intermediate frequency output signal which is an equivalent time replica of the RF input signal to be sampled.

In the prior art, thin film signal samplers have been made in several different forms. In the earliest form, the signal samplers were brass blocks with holes machined therein with suspended center conductor to act as waveguides. One hole was used as a waveguide for the RF signal to be sampled and another hole was used to guide the sample pulses used to turn on the sample gate. The difficulty with these sampling devices was that the frequency at which they could operate was limited by the smallest diameter hole which could be machined into the brass block. The diameter of each waveguide defines the upper frequency at which the waveguide was useful.

A later version of prior art signal sampler design involved hybrid assemblies of discrete components. In this type of device, discrete diodes and thin film quartz substrate technology with integrated planar waveguides was used. U.S. Pat. No. 4,672,341 is representative of this technology. The difficulty with this approach was that integration on the substrate was on both sides with an integrated waveguide on the front side bringing the sample pulse in and an integrated waveguide on the back side bringing in the RF signal to be sampled. The structure of the device also involved a third layer microstrip. The RF signal to be sampled was guided through a via hole to the diodes on the top side of the substrate. This via hole caused extra parasitic inductance in the signal path and put a limit on the bandwidth for the signal sampler.

Performance of these hybrid structures was limited by how well the three layer structure could be fabricated and aligned as well as the intrinsic limitations caused by the spatial separation of the sample pulse generating structure from the sampling diodes. At frequencies in the range of hundreds of GHz, with signals traveling at approximately one-third the speed of light along the waveguides, even the smallest spatial separation between devices can cause losses and dispersion, and results in parasitic components which limit the bandwidth. Therefore, even a 100 micron misalignment in fabrication of such a structure translates to a one picosecond penalty. Since the desired aperture time is less than 5 picoseconds for a large bandwidth, such misalignment errors can substantially adversely affect the bandwidth by rendering it impossible to get a fast edge to the differentiator to generate a very short sample pulse. To get a fast edge to the differentiator, it is necessary to have very close spatial proximity between the structure which generates the short sample pulses and the signal line carrying the signal to be sampled.

An attempt at improving the hybrid structure is found in the latest generation of Hewlett Packard's signal samplers dating from February of 1986. In this latest generation of signal samplers, integrated gallium arsenide diodes are used for sampling the RF signal. Beam leads couple these diodes to step recovery diodes which generate the sample pulses which turn the gallium arsenide diodes on. The pulse generator, however, is not integrated on the same substrate with the differentiator because prior to the invention described herein, it was believed that no workers in the art were in possession of gallium arsenide pulse generator of a monolithic design. In the Hewlett Packard design, integrated diodes, resistors, and capacitors are formed on the gallium arsenide substrate. These integrated components are connected by beam leads bonded to pads on the substrate to make connection to the other elements of the sampler circuit. The nonintegrated structures are a differentiating line to differentiate the voltage steps from the step recovery diodes to generate the sample pulses used to turn on the gallium arsenide diodes, and a microstrip line integrated on another substrate. Thus, the Hewlett Packard design requires at least two substrates with connections between them. This spatial separation between the pulse generation circuitry and the sampling diodes causes losses, dispersion, and parasitics which limit the bandwidth of the sampler.

It is highly desirable in many applications to work with RF signals having very high frequencies such as 300 GHz. To be able to see these signals on low frequency oscilloscopes for analysis, testing, and other purposes, it is necessary to down convert them to a lower frequency. One way of doing this is to sample these signals to generate a replica signal at a lower frequency which is within the range of frequencies which can be observed on commercially available oscilloscopes. To do this requires a very high bandwidth signal sampler which can generate sample pulses to turn on the sampling diodes having a pulse width on the order of less than 2 picoseconds. This requires precise control of dimensions and close proximity of all elements such as can be obtained in fully integrated, planar structures.

Therefore, a need has arisen for a signal sampler with a fully integrated monolithic design wherein spatial separation between the pulse generator and the sampling diodes is minimal, and wherein dimensional controls can be very exact.

Also a need has arisen for a more compact integrated nonlinear transmission line structure. This structure must have a characteristic impedance which is high enough to yield an overall characteristic impedance of approximately 50 ohms when loaded by a plurality of Schottky barrier varactor diodes.

SUMMARY OF THE INVENTION

According to the teachings of the invention, there is taught a fully integrated, monolithic signal sampler formed on a gallium arsenide substrate using conventional planar processing. In the preferred embodiment, an integrated coplanar waveguide is used to implement the nonlinear transmission line used to generate sample pulses for the sampler. In an alternative embodiment, an integrated coplanar strip nonlinear transmission line is used for sample pulse fall time compression.

The gallium arsenide substrate is layered by molecular beam epitaxy to have buried N+ layer beneath an N− layer. On this gallium arsenide substrate there is fabricated a pulse generator in the form of either a coplanar waveguide or a coplanar strip nonlinear transmission line which is periodically loaded with Schottky varactor diodes. This device shapes sample pulses received from a local oscillator. These sample pulses, when they arrive at the input on the nonlinear transmission line, have a first rise time (or fall time depending upon the convention chosen) which is altered as the sample pulses propagate down the nonlinear transmission line. This fall time compression happens by action of the varactor diodes which have a junction capacitance which is voltage dependent. This causes the group velocity of signal propagation to be voltage dependent. The sample pulses propagate along the nonlinear transmission line toward the locations of a pair of gallium arsenide, integrated sample diodes. As the sample pulses propagate down the nonlinear transmission line, the rise time of the sample pulses is substantially shortened. The rise time is less than 5 picoseconds for the sample pulses emerging from the nonlinear transmission line compared to 100 picoseconds for the input pulses.

A coplanar waveguide transmission line is integrated on the same substrate and receives at its input the RF signal to be sampled. This RF signal can have a frequency of up to 300 GHz in the preferred embodiment. The sampling diodes are coupled to the RF transmission line in a balanced, antiparallel relationship to maintain isolation between the RF and the input port and output port.

The sample pulses emerging from the integrated nonlinear transmission line, hereafter called intermediate pulses, are differentiated to generate a series of delta function sample pulses. These delta functions have a pulse width which is approximately equal to the rise time of the intermediate sample pulses. As each intermediate pulse arrives, it turns on the sample diodes. Differentiation is accomplished by coupling the intermediate sample pulses to a slot line acting as a shunt inductor. The slot line is a pair of shorted groundplane sections of the RF signal coplanar waveguide RF transmission line. The integrated conductors of the nonlinear transmission line are coupled only to the two ground planes of the RF signal coplanar waveguide transmission line through a 50 ohm termination and excites the slot line mode of propagation therein. The intermediate pulses propagate in slot line mode in two directions away from the point of coupling between the integrated nonlinear transmission line and the RF signal coplanar waveguide transmission line. Propagation in each direction continues until an air bridge termination shorting the two ground planes is encountered in each direction. These short circuit terminations cause reflection of the intermediate, i.e., sample pulses back toward the point of injection.

As each intermediate or sample pulse arrives back at the point of injection into the ground planes of the RF coplanar waveguide, it turns off the pair of integrated gallium arsenide Schottky sampling diodes. These diodes are coupled through integrated capacitors to the ground plane conductors of the RF signal coplanar waveguide transmission line. These sample diodes are integrated adjacent to the position of injection of the intermediate or sample pulses into the RF coplanar waveguide transmission line.

The dimensions of the slot line portion of the RF coplanar waveguide transmission line, i.e., the portion between the injection point of the sample pulses from the nonlinear transmission line and the reflection point, i.e., the air bridge shorting the RF coplanar waveguide groundplanes together, are established such that the round trip travel time for the signals emerging from the nonlinear transmission line from the point of injection to the point of reflection and back again is approximately equal to the rise time of the intermediate or sample pulses emerging from the nonlinear transmission line, and the characteristic impedance is 78 ohms whereas the characteristic impedance of the nonlinear transmission line is 50 ohms. This impedance mismatch is for the purpose of development of as high a voltage as possible across the sampling diodes in the integrated sample head.

An integrated resistor formed in the N+ layer of the gallium arsenide substrate couples the nodes between each of the sampling diodes and the associated integrated capacitor. A center tap on this integrated resistor serves as the output node for the system from which the intermediate frequency (IF) signal can be extracted. This IF signal is a replica of the RF signal in that it has the same voltage at points of corresponding phase as the voltage of the RF signal, but the IF signal has a frequency which is substantially less than the RF signal frequency.

Also disclosed for the alternative embodiment of the sample head or standing alone as a pulse compressor is an integrated coplanar strip (CPS) nonlinear transmission line. This structure is comprised of a pair of parallel conductors integrated on the surface of a lightly doped active area of epitaxially grown semiconductor. Under this lightly doped epitaxial layer lies a buried layer of heavily doped epitaxially grown semiconductor which is used to reduce the series resistance of diodes to be formed in the epitaxial layer. Isolation islands are formed periodically along the CPS line by ion implant damage. In each isolation island a Schottky barrier varactor diode is formed. In some embodiments, a hyperabrupt doping profile is used for the diodes.

The cathodes of the diodes are ohmic contacts formed in holes etched through the lightly doped epitaxial layer to make direct contact with the buried layer. The anode contact is Schottky metal in direct contact with the lightly doped epitaxial semiconductor layer. The spacing between the anode and diode contacts is kept to the minimum spacing allowed by the design rules. All the diode anodes are coupled to one conductor of the CPS line. All the cathode contacts of the diodes are coupled to the other CPS conductor.

BRIEF DESCRIPTION OF THE DRAWINGS

FIG. 12 is a plan view of the structure of the of a nonlinear transmission line.

FIG. 13 is a plan view of the outline of the isolation implant mask.

FIG. 14 is a plan view of the diode, including diode contact region and ohmic contact regions.

DETAILED DESCRIPTION OF THE PREFERRED EMBODIMENT

Figure 1:
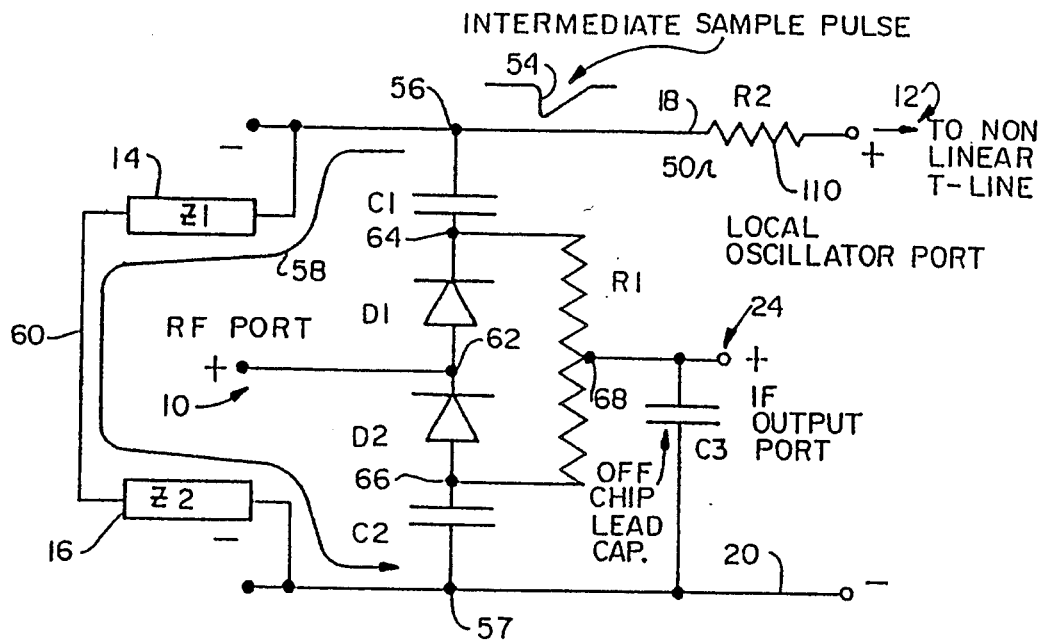
FIG. 1 is a schematic diagram of a sample head using a coplanar waveguide transmission line for compression of the sample pulses.

Referring to FIG. 1, there is shown a schematic diagram of the signal sampler which is implemented in integrated form according to the teachings of the invention. The circuit of FIG. 1 receives a high frequency RF signal to be sampled at an RF port 10. A local oscillator port 12 receives local oscillator sample pulses, usually sawtooth in shape, at a frequency such that the $n_{th}$ harmonic of the local oscillator frequency is offset from the fundamental frequency of the periodic RF signal to be sampled by a frequency Delta. The local oscillator pulses are differentiated by a shunt inductance symbolized by the impedances Z1 and Z2, 14 and 16, respectively in FIG. 1. These shunt inductances are implemented by a short-circuited section of a slot line portion of the coplanar waveguide serving to guide the RF signal to be sampled and will be described in more detail below. The slot line guides the sample pulses to the location of an air bridge short circuit termination where they are reflected back toward nodes 56 and 57. The resultant voltage between nodes 56 and 57 is the derivative of the sample pulse. The sample pulse propagates along the slot line in the even mode whereas the RF propagates along the coplanar waveguide in the odd mode thereby minimizing coupling between the two signals.

The sample pulses appearing across nodes 56 and 57 turn on diodes D1 and D2 each time a sample pulse occurs. Because the RF signal is offset from the $n_{th}$ harmonic of the local oscillator frequency by the frequency Delta, the sample pulses will sample the RF wave form once every n cycles. There results an output signal at an intermediate frequency at an intermediate frequency (IF) output port 24. This sampling process is illustrated in FIG. 2.

Figure 2:
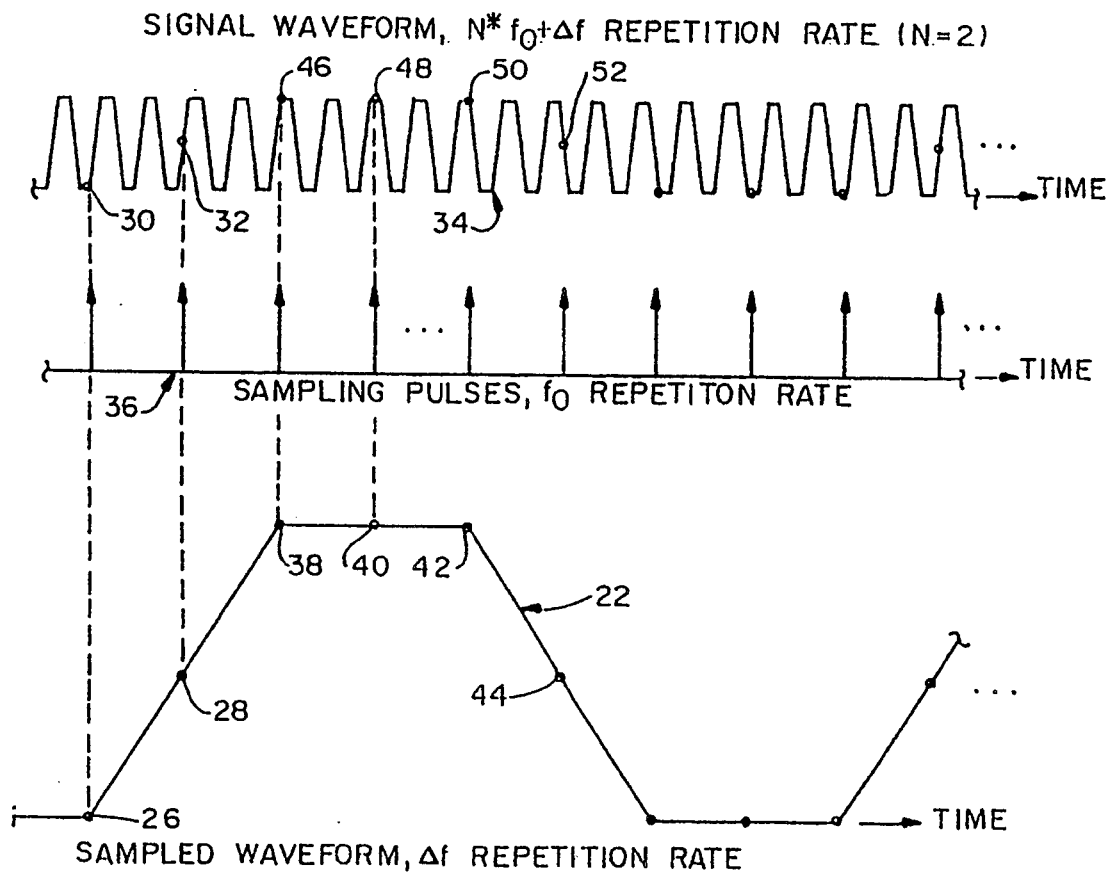
FIG. 2 is a diagram illustrating equivalent time sampling.

In FIG. 2, the wave form 22 represents the output signal at the intermediate output port 24 in FIG. 1. The points marked 26, 28, 38, 40, 42 and 44 are typical sample points, and correspond, respectively, to the points 30, 32, 46, 48, 50 and 52 on the RF wave form 34. The wave form 34 is the signal to be sampled and must be periodic.

The impulses shown at 36 represent the differentiated sample pulses, and are termed Delta functions. The sample pulses occur at a repetition rate of $f_0$ which is the local oscillator (LO) frequency. Delta functions are the most desirable form of sample pulse to use because the harmonic amplitude of a Delta function pulse is level throughout the harmonic spectrum. This allows a broader range of RF frequencies to be sampled without voltage conversion loss. The integrated nonlinear transmission line allows the rise time of the incoming sample pulses to be substantially shortened. When this fast edge is differentiated, a sampling pulse results which has a pulse width which is substantially equal to the rise time of the fast edge. Since this pulse width can be anywhere from 7.8 picoseconds to 1.5 picoseconds, an approximation of a true Delta function having a pulse width substantially near 0 can be achieved with the integrated, monolithic structure of the invention.

Inspection of FIG. 2 shows how the occurrence of the sampling pulses corresponds to the sample points on the RF wave form 34 and the corresponding points on the wave form shown at 22. The sampled output wave form occurs at a frequency of Delta. Note also that the voltage at the sample point 26 corresponds to the voltage of the RF wave form at sample point 30 while the voltage at the sample point 28 corresponds to the voltage of the RF sample waveform 34 at point 32. Likewise, the sample voltage at points 38, 40, 42, and 44 correspond, respectively, to the voltage at the points 46, 48, 50, and 52 on the RF waveform 34.

The manner in which this sampling is accomplished is as follows. Referring to FIG. 1, consider the case where the RF is off such that no RF signal 34 appears at the port 10. Assume that the local oscillator is turned on at time T=0 and that intermediate sample pulses such as the pulse shown at 54 begin arriving at the node 56. The current resulting from each intermediate sample pulse travels along the path 58 through the inductance segments Z1 and Z2 representing the inductance of the slot line portion of the RF coplanar waveguide. It can be shown from network theory that the voltage at node 56 is equal to the derivative of the input voltage at the local oscillator port 12 times a constant equal to the round trip inductance of the short circuited slot line path divided by the resistance in series with the path.

Note that the intermediate sample pulse 54 has a one edge which is much shorter than the other edge. It is the differentiation of this sharp rise time which causes the Delta function sample pulses shown at 36 in FIG. 2. The first sample pulse is at least two volts and therefore turns both diodes D1 and D2 on hard for the duration of the sample pulse. When the pulse is over, a large amount of current has passed in the forward direction through capacitors C1 and C2, but very little current has passed through them in the reverse direction. This leaves a charge Q on capacitors C1 and C2, which gives rise to a voltage Q/C1 reverse biasing diode D1 and Q/C2 reverse biasing the diode D2. Because the diodes are now slightly reverse biased, the next sample pulse does not turn the diodes on quite as hard as they were turned on by the first sample pulse. However, the diodes are still forward biased by the second sample pulse which causes more charge to be left on each of the capacitors by the end of conduction of the second sample pulse. This process continues until the reverse charge leaks through and around the diodes D1 and D2 through the resistor R1 just equals the forward charge stored during a sample pulse interval. This equilibrium condition will always occur at a fixed voltage $V_r$ across the diodes for a given pulse amplitude and resistance R1.

Now consider the case where the RF signal is on, but the frequency of the RF is an exact harmonic frequency of the local oscillator fundamental frequency. This means that the sample pulse will always occur at the same place in each RF signal cycle. Therefore, whenever the diodes are on, the RF signal will have the same voltage at node 62 in FIG. 1. The diode pair D1 and D2 will now self bias in the manner described in the previous paragraph until each diode has regained its reverse bias voltage $V_r$. Thus, if the voltage at node 62 is $V_{RF}$ when the sampled pulse arrives, then the voltage at node 64 is $V_r+V_{RF}$, and the voltage at node 66 is $-V_r+V_{RF}$ in the steady state. This means that the voltage at the center tap node 68 of the resistor R1 is simply the DC value, $V_{RF}$.

If the fundamental frequency of the RF signal at the RF port 10 is offset from some harmonic of the local oscillator by the frequency Delta, then the sample pulses will cause sample voltages at the output node 68 that will trace out one complete RF waveform cycle in the interval 1/Delta seconds. This means that the time axis of the RF signal has been scaled by a factor of $f_{RF/Delta}$ with no voltage conversion loss in the ideal case. Thus it is seen that the final output signal at node 68 is the same as the RF input signal except it is on a scaled time axis.

In time domain instruments, it is important that the amplitudes of the RF signal harmonics be preserved as well as preserving the shape of the RF fundamental signal. Of course, if the RF signal is a sign wave, there are no harmonics. However, the signal sampler of the invention works with any periodic RF signal, and it is well known that periodic signals of a nonsine wave nature have harmonic components defined by the Fourier expansion of the time domain function representing the signal. In accordance with the teachings of the invention, sample pulses having pulse widths substantially approximating the pulse width of a Delta function are used. The result is an absence of voltage conversion loss because of the unity strength of the harmonics of the local oscillator frequency at every harmonic of interest.

There is power conversion loss in the system of the invention since the RF is being sampled for a small fraction of each cycle.

The time scale factor relating the time access of the RF signal 34 in FIG. 2 and the time scale of the sampled waveform 22 in FIG. 2 is $f_{RF}/f_{IF}$ where $f_{IF}$ is the intermediate frequency of the output signal at node 68. This is the difference frequency between the frequency of the RF signal, $f_{RF}$, and the nearest harmonic of the local oscillator frequency, i.e., Delta. Real time on the time axis of the signal 34 in FIG. 2 is multiplied by this scale factor to yield the equivalent time on the time axis for the signal 22 in FIG. 2. If the intermediate frequency waveform is displayed on an oscilloscope, the horizontal axis of the display will be in equivalent time. Actual time is obtained by dividing by the scale factor. The process symbolized by FIG. 2 is referred to as "equivalent time sampling".

Figure 3:
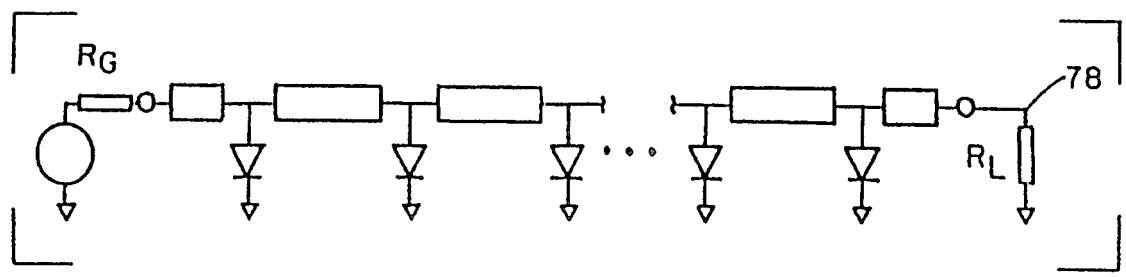
FIG. 3 is a block diagram of a nonlinear transmission line.

Referring to FIG. 3, a short summary of the operation of nonlinear transmission lines will be helpful in understanding the operation of the equivalent time sampling circuit according to the teachings of the invention.

Figure 4A:
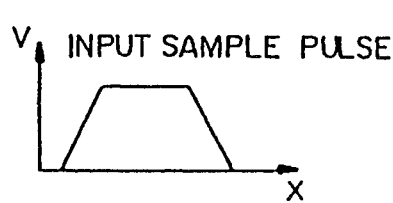
FIGS. 4(a) and 4(b) are illustrations of the input sample pulse to the nonlinear transmission line and the output intermediate pulse therefrom.
Figure 4B:
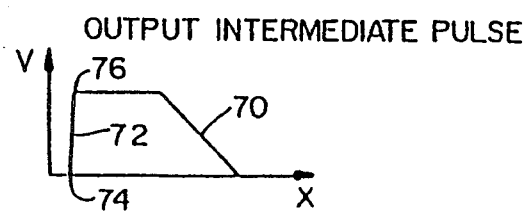

A nonlinear transmission line is a relatively high impedance transmission line which is periodically loaded with Schottky diodes serving as voltage-dependent shunt capacitances. FIG. 3 is an equivalent circuit diagram for a nonlinear transmission line such as is used in the invention and FIG. 4(A) shows the input pulse entering the nonlinear transmission line while FIG. 4(B) shows the shape of the output pulse which emerges as a result of propagation of the input pulse down the nonlinear transmission line. The propagation delay time per section of the line is equal to the square root of the transmission line inductance times the line capacitance per section. The nonlinear capacitors make the propagation delay time a function of voltage. For the diode polarity shown in FIG. 3, the diode capacitance increases with voltage so a more positive voltage on the line will have a longer delay time. This allows the more negative portions of the trailing edge of a pulse to catch up with the more positive portions of the trailing edge and the peak which shortens the rise time (or fall time depending upon perspective) of the trailing edge. Further, the voltage dependent capacitance causes the more positive peak to lag behind the more negative portions of the leading edge as is illustrated in FIG. 4(B).

While the voltage dependent delay time causes one edge of an input pulse to get steeper and stretches out the other edge, dispersion on the line causes both edges to stretch out. The rise time of the pulse will therefore be reduced as the pulse propagates along such a nonlinear transmission line until, finally, the tendency of the nonlinear delay to reduce the rise time just balances the tendency of the dispersion to increase the rise time. If diode series resistance can be neglected and the diode capacitance is much larger than the capacitance per section of the line, the final limited fall time of the pulse at the output of the nonlinear transmission line is on the order of but longer than the square root of the inductance of the line section times the capacitance per section. If the nonlinear transmission line is implemented in the form of a monolithic integrated circuit, this limiting rise time can be less than a picosecond.

Rise times of 7.8 picoseconds to 1.5 picoseconds are obtainable with today's process technology. Since the slope of the edge 70 in FIG. 4(B) is negligible compared to the slope of the edge 72, the derivative of the waveform of FIG. 4(B) is a narrow impulse function having a pulse width equal to the rise time of the edge 72. Hereafter, the time between the points 74 and 76 on the waveform of FIG. 4(B) will be referred to as the rise time, although it can also be called the fall time.

The diode arrangement of FIG. 1 is used because it allows both diodes to have the same polarity to the local oscillator. However, to the RF signal to be sampled, the diodes still appear to be anti-parallel, thus imposing only odd harmonic distortion on the RF signal. This arrangement provides natural isolation between the RF signal and the local oscillator signal since the local oscillator output is a balanced signal while the RF signal is unbalanced. Since the short circuited transmission line represented by the inductances 14 and 16 differentiate the oscillator waveform, that waveform can be a square wave or sawtooth wave rather than a series of impulses. Generation of a series of impulses by a local oscillator is possible but difficult.

Assuming that the local oscillator pulse is narrow enough, diode capacitance and series resistance directly determine the bandwidth of the sampler in two ways.

First, the capacitor loading of the shunt diodes on the RF line causes the RF voltage at the diodes to have a pole in its frequency response at a frequency 1/25 C. Thus for an RF bandwidth of 300 GHz, the capacitance of the diode loading has to be less than 10 femptofarads per diode. Second, diode capacitance and series resistance determine the turn-on time of the sampling diode. In the circuit of FIG. 1, it can be shown that the turn-on time of the sampling diodes is 1.8 picoseconds (10% to 90% rise time). This rise time exists for a local oscillator source resistance of 100 ohms, a characteristic impedance of 75 ohms for the shorted slot line, a series diode resistance of 60 ohms and for the series capacitance of the two diodes equal to 5 femptofarads. This means that if the diode is biased so that it turns on at the 85% point of the applied sample pulse, and if the shorted transmission line round trip line is 4 picoseconds, that the sampling diodes will be on for 1 picosecond yielding a bandwidth of roughly 300 GHz.

In order to achieve the high bandwidth and low values for the parasitic elements given in the previous example, it is necessary to have the local oscillator drive the sampling circuit with sufficient edge speed to develop the needed voltage across the short circuited slot line before the reflected wave returns from the short circuit termination and shuts the sampling diodes off. This means, for the design of the previous example, that the transition time or edge speed of the intermediate pulses emerging from the nonlinear transmission line must be preferably less than 4 picoseconds. By using a nonlinear transmission line to reshape the input pulse, usually a sinewave, from the local oscillator, this transition time requirement can be met. However, to couple pulses having such a fast edge speed to the local oscillator port of the sample circuit without distortion, the nonlinear transmission line must be integrated on the same chip with the sampling diodes and differentiation circuit. This means that hybrid technology and any construction technology other than full integration on the same surface of a substrate is not acceptable since the dimensional tolerances and spatial separation of these other construction options lead to losses, dispersion and parasitic loading, i.e., parasitic inductance, which would distort or destroy the fast edge speed achieved by the nonlinear transmission line.

According to the teachings of the invention, the sampling head is integrated on the same side of a substrate as a nonlinear transmission line with a single level of metallization plus air bridges. The requirement for monolithic implementation according to the teachings of the invention is quite demanding since it prohibits all prior art structures for sampling head designs which use microstrip or coax-to-slot-line local oscillator drive.

Figure 5:
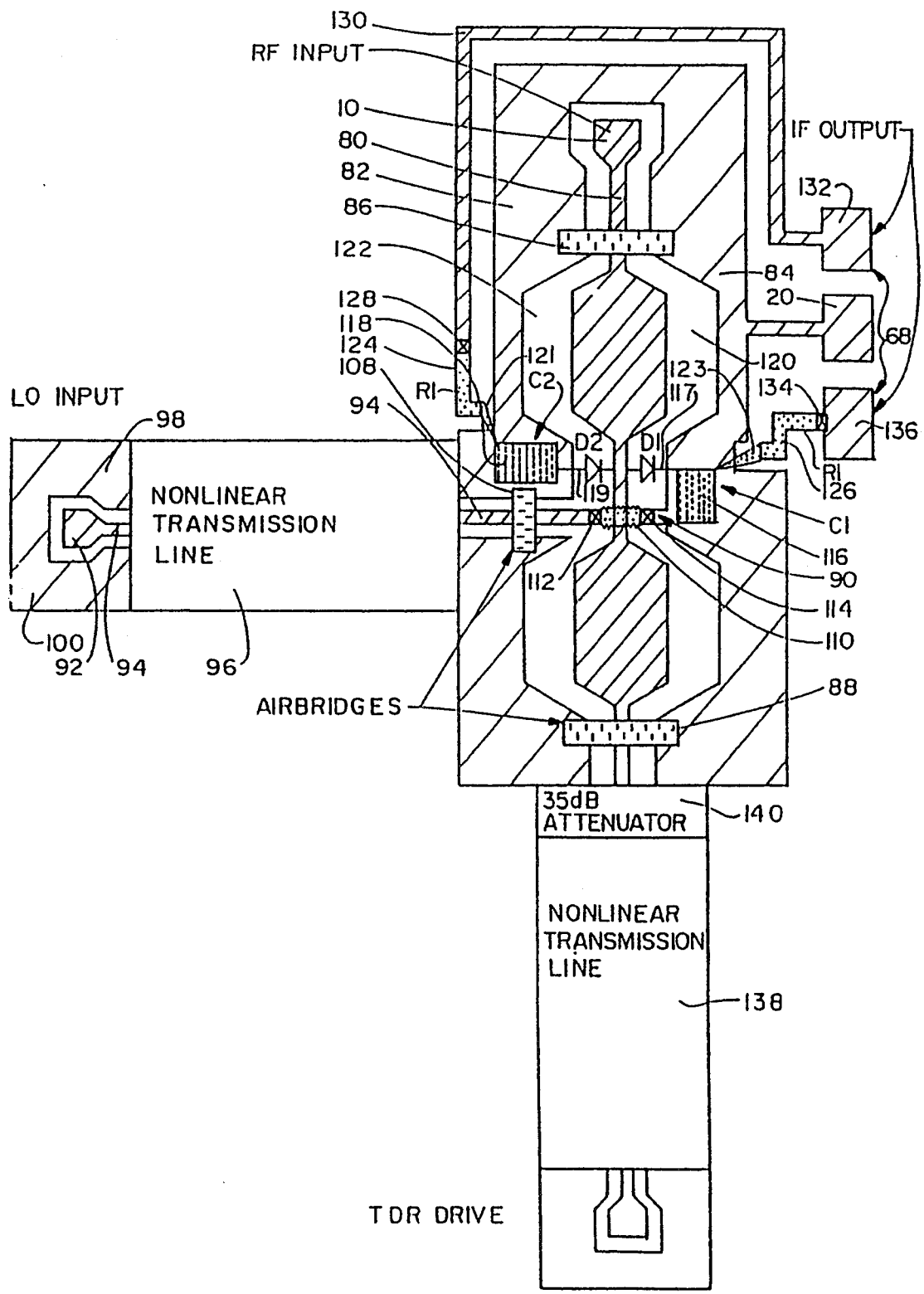
FIG. 5 is a plan view of the layout of a integrated sampling circuit according to one embodiment of the teachings of the invention.

The integrated structure for the sample head according to the teachings of the invention is shown in plan view at overview scale in FIG. 5. In FIG. 5, the RF input port 10 consists of a conductive pad connected to a center conductor 80 of an integrated coplanar waveguide. This integrated coplanar waveguide serves to carry the RF signal to be sampled toward the sample diodes D1 and D2 shown in the middle of FIG. 5. FIG. 5 is intended only to show the layout of the sample head schematically and not the exact integrated structure. More detail of the exact integrated structure will be given in FIG. 7.

The integrated coplanar waveguide for the RF signal is comprised of the center conductor 80 and two ground plane conductors 82 and 84 on either side of the center conductor 80 but which are electrically shorted together at several locations. The substrate is comprised of gallium arsenide, which has an N+ buried layer lying beneath an N− layer both layers being formed by molecular beam epitaxy. The doping of the N+ layer is $3 \times 10^{18}$ per cubic centimeter, while the doping of the N− layer is $3 \times 10^{16}$ per cubic centimeter. Areas underlying the RF signal integrated coplanar waveguide which need to be insulating such as most of the area between the center conductor 80 and the ground planes 82 and 84 are damaged by proton implants so as to convert the substrate in such areas into a semi-insulating material. This prevents shorting between the center conductor 80 and the ground plane conductors 82 and 84.

An air bridge 86 is formed to connect the ground planes 82 and 84 at a reflection point located away from the sampling diodes. Likewise, an air bridge 88 connects the two ground planes 82 and 84 at a reflection location below the sampling diodes. These two air bridges, 86 and 88, serve as short circuit terminations for the slot line comprised of the ground plane conductors 82 and 84. These short circuit terminations cause reflection of the incoming sample pulses propagating down the ground plane conductors 82 and 84 back toward the point of injection adjacent to the sample diodes.

The point of injection of the sample pulses is labelled LO INPUT. Input sample pulses are coupled to a contact pad 92 formed from the metal of the center electrode 94 of a nonlinear transmission line 96. The nonlinear transmission line also has two ground plane conductors 98 and 100. The structure of the nonlinear transmission line will be described in more detail below. The sample pulses are coupled into the nonlinear transmission line by coupling to the center electrode 94 via pad 92. This causes the sample pulses to propagate down the nonlinear transmission line 96 in coplanar waveguide mode. The sample pulses are compressed in terms of their fall time during propagation down nonlinear transmission line 96. The intermediate pulses which emerge from the nonlinear transmission line are coupled into the RF signal coplanar waveguide at 90 in a manner to excite slot line propagation along ground plane conductors 82 and 84 in both directions up and down the RF CPW. That is, the center conductor 94 of the nonlinear transmission line 96 is coupled only to the ground plane segment 84 at point 90 and the ground plane conductors 98 and 100 of the nonlinear transmission line are coupled to the ground plane conductor 82 the GP conductor 82. This applies the intermediate pulse across the slot in the RF coplanar waveguide so as to excite slot line mode propagation of the intermediate pulses toward the air bridges 86 and 88. An air bridge 108 shorts the two sections of ground plane 82 together (where the GP conductor 82 is separated to provide a gap through which the center conductor 94 of the NLT 96 passes) to suppress even modes of propagation on the nonlinear transmission line and to provide continuity in the RF coplanar waveguide ground plane conductor 82.

A buried 50 ohm resistor 110 formed in the N+ layer of the substrate is used to terminate the NLT 96 carrying the intermediate sample pulses in its characteristic impedance. The center conductor 94 of the nonlinear transmission line 96 makes an ohmic contact to the buried N+ layer via holes etched through the N− layer and shown symbolically at 112 and 114. The center conductor 80 of the RF signal coplanar waveguide is coupled to an airbridge which passes over the buried 50 ohm resistor 110 to make contact with a continuation of the center conductor 80.

The entire substrate is proton implant damaged to render it semi-insulating prior to forming the waveguides thereon. Certain areas are excepted from this proton implant damage, however. Those areas include the buried path of the resistor 110 and the resistors 124 and 126, and the junction areas of the diodes D1 and D2 and all diodes (not shown) of the nonlinear transmission line 96.

The center conductor 94 of the nonlinear transmission line 96 is coupled through the resistor 110 to the ground plane conductor 84. The ground plane conductors 98 and 100 of the nonlinear transmission line are electrically coupled to ground plane 82 of the RF signal coplanar waveguide. As a result, the intermediate sample pulses emerging from the nonlinear transmission line 96 are coupled into the slot line mode of propagation on the RF signal coplanar waveguide at the point of injection 90. Each sample pulse propagates toward the air bridges 86 and 88 and reflected back toward the sampling diodes. When each intermediate sample pulse arrives back at the point of injection, the sample diodes D1 and D2 are turned off thereby stopping the process of charging two integrated capacitors C1 and C2. Each of the capacitors C1 and C2 is comprised of a top plate of plated gold formed over a nitride layer which in turn is formed over a layer of evaporated Schottky metal which forms the bottom plate of the capacitor and is coincident with the ground plane conductors 82 and 84. The top plates of the capacitors C1 and C2 are shown at 116 and 118, respectively.

The resistor 110 implements the resistor labeled R2 in FIG. 1. The capacitors C1 and C2 correspond to the capacitors C1 and C2 in FIG. 1 and the diodes D1 and D2 correspond to the diodes D1 and D2 in FIG. 1. The cathode of the diode D1 is coupled to the top plate of the capacitor C1 by an air bridge 117. The anode of the diode D1 is an extension of the Schottky metal for the center conductor 80 of the RF signal coplanar waveguide and extends out over a junction area of unimplanted N− substrate thereby forming a Schottky diode. Likewise, the anode of the diode D2 is coupled via an air bridge 119 to the top plate 118 of the capacitor C2, while the cathode of the diode D2 is an extension of the center conductor 80 of the RF signal line and makes contact to an unimplanted portion of the N− layer via ohmic contacts to form the Schottky diode.

The resistor R1 in FIG. 1 is implemented by a segment of the N+ buried layer which is masked off during the proton implant. This area is shown as two segments at 124 and 126. The area 124 is coupled to the top plate 118 of the capacitor C2 via an air bridge 121. The air bridge 121 is coupled to the buried resistor segment 124 via an ohmic contact (not shown). The resistor segment 126 is coupled to the top plate 116 of capacitor C1 via an air bridge 123. An ohmic contact couples the air bridge to the buried resistor segment 126. The cross-sectional area and path length of the resistor segments 124 and 126 are equal such that each resistor segment has an equal resistance. The resistor segment 124 is coupled via an ohmic contact at 128 to a conductive path 130 formed on the surface of the substrate which couples the resistor segment 124 to a contact pad 132 serving as output node 68 for the IF signal. The resistor segment 126 terminates in an ohmic contact at 134 to make electrical contact to a contact pad 136 which is also, by off chip connections, the output node 68. Separate contact pads 132 and 136 allows the diodes to be separately biased slightly differently if necessary to balance the circuit.

A second nonlinear transmission line 138 is used to inject test signals into the RF coplanar waveguide for purposes of testing the bandwidth of the sampler. This nonlinear transmission line 138 is not critical to the invention and may be omitted.

A 35 DB attenuator 140 terminates the RF signal coplanar waveguide, thereby rendering the nonlinear transmission line 138 invisible to sources of RF signals coupled to the RF input port 10.

Figure 6A:
FIG. 6(a) is a circuit diagram of the sampling diodes laid out to correspond to the cross-section of the sampling diode structure shown in FIG. 6(b).
Figure 6B:
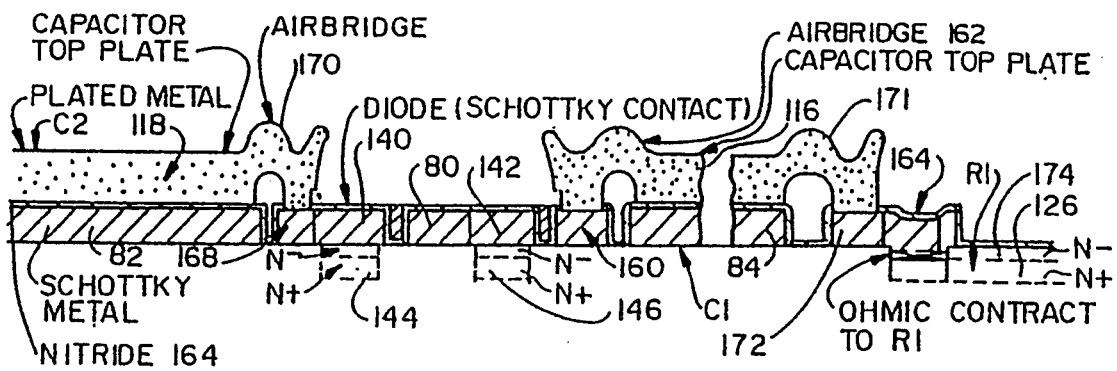
FIG. 6(b) is a cross-section of the diode and RF waveguide structure shown in plan view in FIG. 6(c).
Figure 6C:
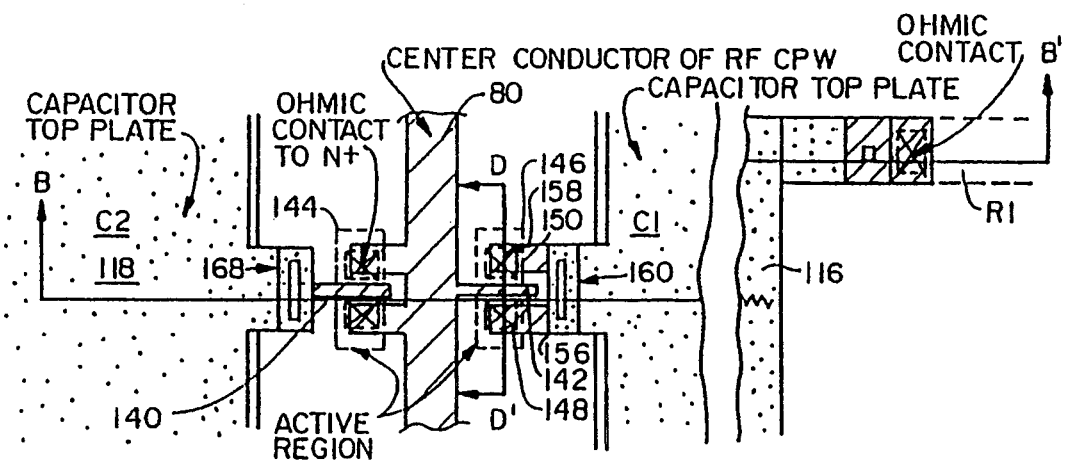
FIG. 6(c) is a plan view of the sampling diode and RF waveguide structure.
Figure 6D:
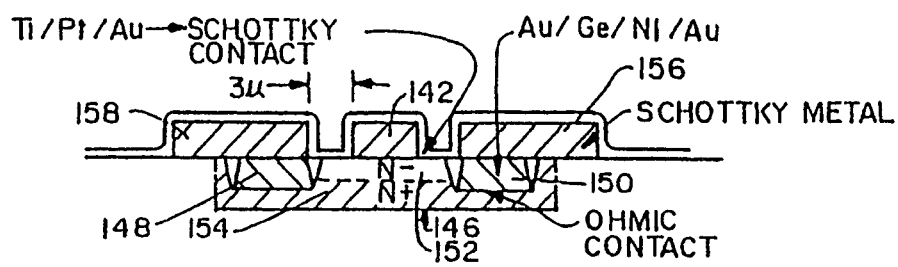
FIG. 6(d) is a cross-sectional view of a sampling diode.

Referring to FIGS. 6(A) through 6(D), there are shown further structural details of the sampling diode section of the preferred embodiment of the invention. FIG. 6(A) represents the schematic diagram implemented by the structure of FIG. 6(B) which is a cross-section through the sampling diode portion of the structure but not passing through the anode portions of the diode structures. FIG. 6(C) is a plan view of the sampling diode and capacitor region of a structure according to the preferred embodiment of the invention. FIG. 6(D) is a cross-sectional diagram showing the structure of each sampling, Schottky diode. The position of the section line BB' in FIG. 6(C) shows the position of the cross-section of FIG. 6(B). The position of the section line DD' in FIG. 6(C) shows the position of the section illustrated in FIG. 6(D). FIG. 6(A) is the schematic diagram of FIG. 1 laid out in a manner to spatially correlate to the structures shown below in FIG. 6(B). Corresponding structures in FIGS. 6(B) and 6(D) have corresponding reference numerals.

Referring jointly to FIGS. 6(B), 6(C) and 6(D), further details of the sampling diode portion of the structure are given. In FIG. 6(C), the diode anodes are shown as projecting fingers of Schottky metal at 140 and 142. An active region of N+ gallium arsenide is shown outlined in phantom for each diode at 144 and 146, respectively.

The center conductor of the RF signal coplanar waveguide is shown at 80. In FIG. 6(B) this is seen as a portion of the Schottky metal layer which is deposited on the surface of the proton implant damaged substrate.

The diode D1 to the right of the center conductor 80 in FIG. 6(C) is illustrated in cross-section in FIG. 6(D). In FIG. 6(D), the diode anode 142 is seen as a strip of Schottky metal placed over the active region 146 between two ohmic contacts 148 and 150 which form connections to the cathode. These ohmic contacts are formed by etching holes down through the N− layer 152 shown in FIG. 6(D) to the level of the N+ buried layer 154 of the active region 146. These holes through the N− layer are aligned under two projecting fingers of Schottky metal 156 and 158 which form the cathode terminals. The outlines of these holes 148 and 150 are shown in dashed lines in FIG. 6(C) under the projecting fingers 156 and 158. The ohmic contact is comprised of a structure consisting of 108 angstroms of germanium, 102 angstroms of gold, 63 angstroms of germanium, 236 angstroms of gold, 100 angstroms of nickel and 6000 angstroms of gold followed by a high temperature 450° C. annealing step to form an alloy. The Schottky diode anode contacts are comprised of a three layer structure including titanium, platinum and gold formed in direct contact with the substrate. The projecting fingers 156 and 158 form the legs of a U-shaped island of Schottky metal best seen in FIG. 6(C) at 160. This U-shaped island of Schottky metal is connected to the top plate 116 of the capacitor C1 by an air bridge 162 best seen in FIG. 6(B). This air bridge 161 is a bridge of conductive metal which joins the U-shaped island of Schottky metal shown at 160 in FIG. 6(C) to the plated metal 116 of the top plate of capacitor C1. Capacitor C1, as best seen in FIG. 6(B), is comprised of a top plate 116 of plated gold separated by a layer of nitride 164 from the bottom plate of the capacitor. The bottom plate of the capacitor is the same layer of Schottky metal used to form the various components of the diodes and the ground plane 84.

The structure of the diode D2 on the left side of the center conductor 80 of the RF signal coplanar waveguide is similar to the structure of D1 except that a T-shaped island of Schottky metal shown at 168 is used to form the anode Schottky contact 140. This T-shaped section 168 is connected by an air bridge 170 to the top plate 118 of capacitor C2. This top plate is separated by the nitride layer 164 from the bottom plate of the capacitor comprising the Schottky metal layer 82. All areas of the substrate shown in FIG. 6(B) except the diode junction areas and the buried resistor R1 at 126 in FIG. 6B are proton implanted and semiinsulating.

The resistor R1 shown in FIG. 1 is best seen in cross-section in FIG. 6(B). An air bridge 171 couples the top layer 116 of the capacitor C1 to an island 172 of Schottky metal. This island 172 is formed over a ohmic contact hole which has been etched through the N− layer 174 to the N+ layer below. In FIG. 6(B) only the resistor segment 126 is visible. The Schottky metal 172 contacts a gold-germanium alloy in contact with the N+ layer 126 to form an ohmic contact. A similar structure exists on the other side of the RF signal coplanar waveguide making contact between the top plate of the capacitor C2 and the resistor segment 124 (not shown).

The method for forming air bridges is well known in the art of gallium arsenide processing but will be summarized here for completeness. A complete description of the process for fabricating the structure of the preferred embodiment is appended hereto as Appendix A. The first step in forming an air bridge between two metal patterns to be connected is to deposit the metal and pattern it to form the two nodes to be connected. Following this, a first layer of photoresist is deposited to coat the entire wafer. Thereafter the photoresist is developed in the area where the bridge is to be formed so as to leave contact holes to the metal surfaces to be electrically connected. Metal evaporation follows with an evaporation of 100 angstroms of titanium, 2000 angstroms of gold and another 300 angstroms of titanium being typical. This evaporated metal covers not only the exposed surface of the metal nodes to be connected but also the exposed surfaces of the photoresist. Next, a second layer of photoresist is deposited and developed to open a hole in the second layer of photoresist in the area where the air bridge is to be formed. The developing step for the second layer of photoresist includes formation of a contact hole to the evaporated metal layer for use in making contact for electroplating of a later defined gold layer. In the locations where the air bridge is to be formed, the top titanium is etched away to expose the underlying 2000 angstrom layer of gold. Then two microns of gold are electroplated onto the wafer by making electrical contact to the evaporated metal layer. After electroplating the gold, the top layer of photoresist is dissolved by spraying the wafer with acetone. This leaves the evaporated layers of titanium, gold and titanium in the areas outside the area of the bridge exposed. These three layers of evaporated metal outside the bridge are then etched away in a conventional manner. Finally, the wafer is dipped in acetone to dissolve the remaining layer of photoresist to leave the air bridge standing between the two nodes to be connected.

Figure 7:
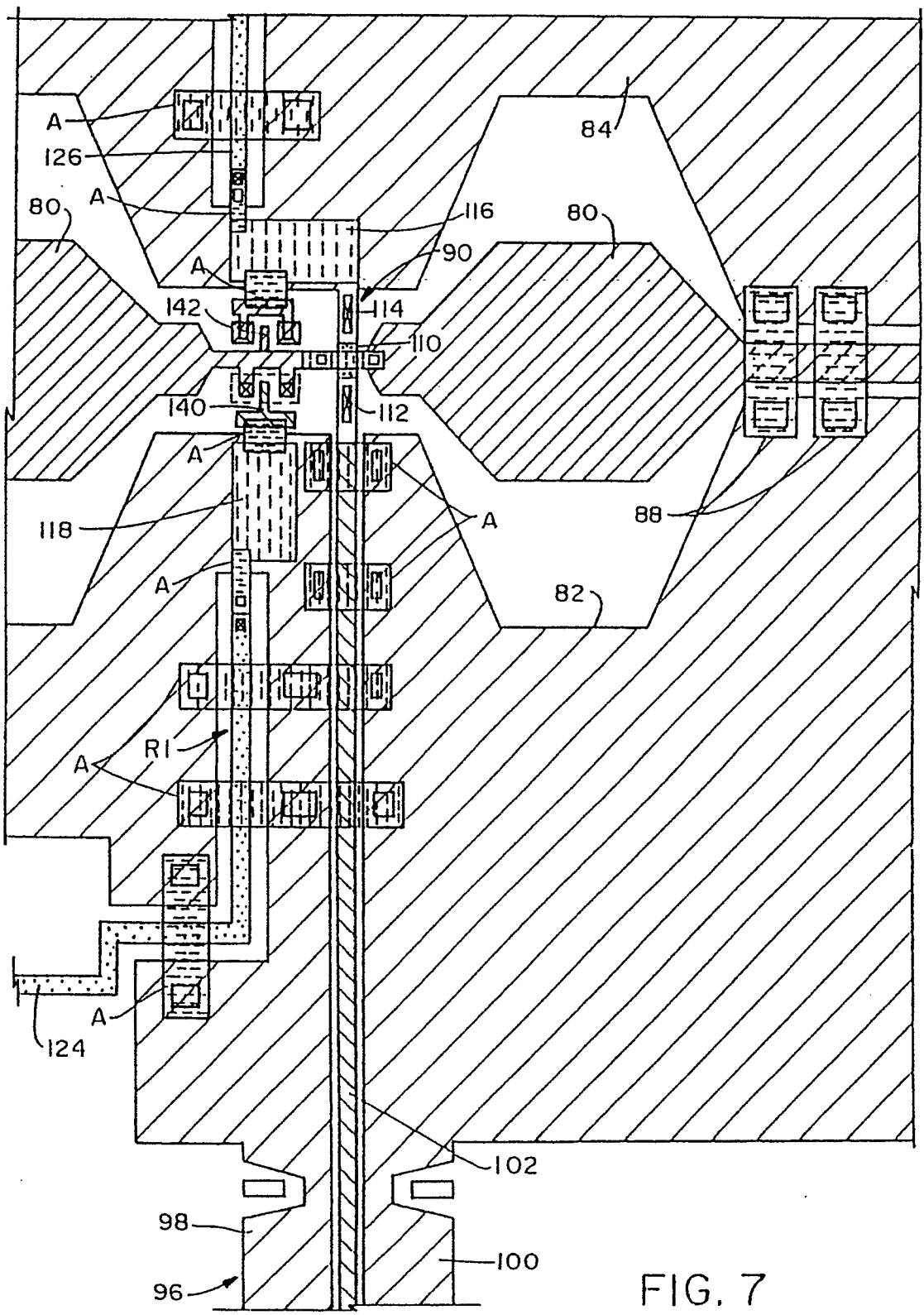
FIG. 7 is a partial plan view of the integrated sample head showing the interconnections of the diodes, capacitors, resistors and coplanar waveguides which are combined to implement the circuit of FIG. 1.

Referring to FIG. 7, there is shown in plan view a layout of the sampling diode portion of the preferred embodiment of the invention to show more detail regarding the interconnection of the various structural components. In FIG. 7, structures which coincide with structures detailed on FIGS. 5 and 6, share the same reference numerals. The rectangular boxes inside the air bridge structures represent the metallic posts which support the air bridge. Rectangular boxes with Xs inside represent ohmic contacts to the underlying N+ layer. The multiplicity of air bridges across the gaps between ground plane conductors are used to maintain the separate segments of ground plane conductor at equal potentials so as to suppress even or slot line mode propagation. Because the mode of propagation for the sample pulses along the coplanar waveguide including center conductor 102 is even whereas the mode of propagation along the slot line portion of the RF signal coplanar waveguide is odd, there is little coupling between the RF signal coplanar waveguide and the coplanar waveguide carrying the sample pulses. Each coplanar waveguide has two propagation modes, CPW and slot-line. The odd mode, here called the CPW or coplanar waveguide mode, has electric field lines which point away from the center conductor across the gaps and toward the ground plane conductors. The even mode, here referred to as the slot line mode, has electric field lines which point in the same direction across the gaps between each ground plane and the center conductor. As long as the loading on the RF signal coplanar waveguide is symmetric about the center conductor, the slot line mode will not couple to the coplanar waveguide mode carrying the RF. It will be noted from FIG. 7 that the sampling diodes and series capacitors connected across the slot are arranged to load the RF signal line symmetrically.

The intermediate pulses arriving in CPW mode from the nonlinear transmission line are coupled in slot line mode into the RF signal coplanar waveguide at point 90. After traveling for two picoseconds along the slot line in both directions, the intermediate pulses encounter an air bridge shorting together the two ground planes which form the slot line. Only one such air bridge is shown at 88 in FIG. 7 with the air bridge to the left of the injection point 90 being out of view but shown at 86 in FIG. 5. The air bridges short out the intermediate pulse waveform and brings the voltage back to 0 at the diodes after the four picosecond round trip time thereby shutting off the diodes. The resulting voltage waveform across the diodes appears as a differentiated version of the intermediate pulse.

Figure 8:
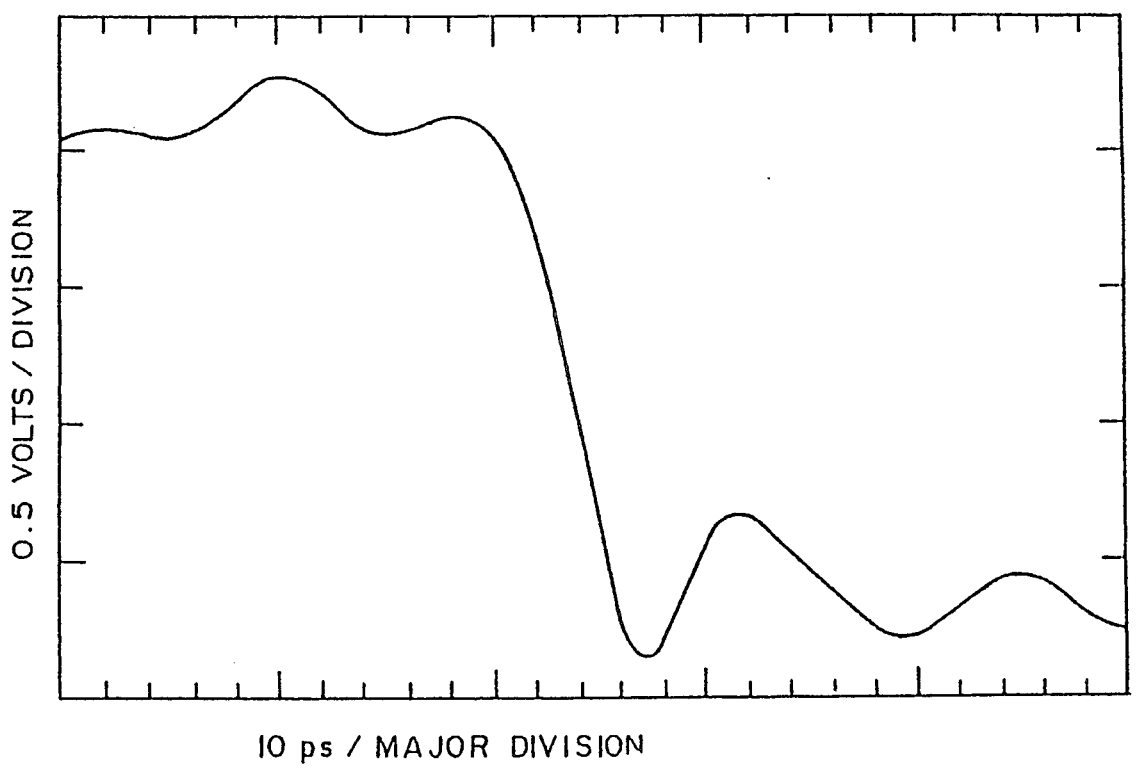
FIG. 8 is an illustration of a fast edge which was sampled using a sample head having the construction of FIG. 7.

The bandwidth of the sampler circuit is so large, it can only be measured indirectly through a built-in TDR pulse generator shown at 138 in FIG. 5. This built-in TDR pulse generator is identical to that used to generate the local oscillator intermediate pulses. The transition time at the output of the nonlinear transmission line 138 should be on the order of 2.8 picoseconds. The transition time measured by the sampling head is 4 picoseconds as shown in FIG. 8. With a nonlinear transmission line having an 8.5 picosecond per millimeter reduction in fall time of a length sufficient to provide a falling edge of less than 2.5 picoseconds fall time with larger amplitude, it is possible with the sampler head design of FIG. 7 to achieve sampling head bandwidth of 200-300 GHz. A larger intermediate pulse output amplitude will allow the differentiating slot line to be made narrower thereby eliminating the need for the hour glass shape of the RF sample coplanar waveguide. The hour glass shape is used in the embodiment shown in FIG. 7 to emphasize the inductance by increasing path length so as to increase the amplitude of the sample pulses that turn on the diodes. Because the amplitude of the sample pulse is the derivative of the input voltage of the intermediate sample pulse times a constant equal to the inductance of the round trip path from the injection point to the air bridge and back again divided by the resistance of this path, increased inductance increases the voltage of the sample pulses across the diodes.

Improvement in the sampling bridge performance can also be made by using lower resistance diodes. In the embodiment shown in FIG. 7, the junction area is 2×5 microns which results in a 12 femtofarad 0 bias capacitance. With suitable adjustments in geometry and doping, lower diode series resistance and possibly lower junction capacitance can be achieved.

The conversion efficiency of the sampling head design of FIGS. 5 through 7 when measured at 5 GHz and the intermediate frequency output port externally loaded by a 330 picofarad capacitance (cable capacitance of connections to chip) represented by capacitor C3 in FIG. 1, and a 1 megohm parallel resistance, resulted in no voltage conversion loss within the accuracy of the measurement (0.5 dB). The power conversion loss was 43 dB which was also the approximate noise figure. This yields a minimum detectable signal of 90 nanovolts per square root Hertz. For an intermediate frequency bandwidth of 10 kHz, the minimum detectable voltage is 9 microvolts. The sampler was observed to be within 0.6 percent of linearity from −60 dBm to +3 dBm. The RF to IF isolation ("blow-by") was 55 dB, while local oscillator to IF isolation was 63 dB, and local oscillator to RF isolation ("kick-out") was 68 dB.

An ideal sampler would have perfect isolation between all ports except at the intermediate frequency where a time scaled representation of the RF signal would appear with no voltage conversion loss in amplitude to any RF frequency. Further, the local oscillator and RF ports of an ideal sampler would be perfectly matched at all frequencies. When parasitics are accounted for in the sampler model, however, it is possible for the RF to couple directly or "blow-by" to the intermediate frequency port through diode capacitance and reverse leakage. Loss of isolation between the local oscillator and RF ports can occur if the bridge is not perfectly balanced or if the intermediate frequency drive is not balanced. Such imbalance can result in "kick-out" of the local oscillator pulse onto the RF line. Imbalance also causes a DC offset in the intermediate frequency voltage proportional to the local oscillator amplitude. These considerations must be taken into account when designing a layout for a structure according to the teaching of the invention.

Other layouts are possible besides the structure illustrated in FIGS. 5 through 7. For example, a series capacitor arrangement could be used to differentiate the intermediate pulses, however, the layout shown in FIG. 7 is more convenient since the parasitic inductance of the slot line differentiator is used to form the differentiating circuit.

Although the fabrication of the device is completely specified in Appendix A, a short summary of the fabrication is given here for completeness. Schottky diodes are formed on gallium arsenide molecular beam epitaxy material with a 0.6 micrometer N− active layer with $3 \times 10^{16}$ per cubic centimeter doping. A buried 0.8 micrometer N+ layer with $3 \times 10^{18}$ per cubic centimeter doping provides both the diode cathode connection and, on the nonlinear line, a resistive connection between the two coplanar waveguide ground planes, suppressing propagation of the slot line mode. Ohmic contacts having 0.02 ohms-millimeter resistivity are formed by a 0.75 micrometer recess edge, self-aligned gold/germanium/nickel/gold lift-off, and a 450° C. alloy. Proton implantation using both 110 keV implant at a dose of $7 \times 10^{14}$ per square centimeter and a 190 keV implant at a dose of $1 \times 10^{15}$ per square centimeter is performed. This proton implant damages the substrates sufficiently to provide greater than 40 megohm per square isolation. During implantation, a 1.6 micrometer gold mask on top of a 1.4 micrometer polyimide layer protects the ohmic contacts on the diode active region. The interconnections are formed with 0.1 micrometer titanium/0.75 micrometer platinum/1.4 micrometer gold lift-off. Schottky diodes are formed in regions where the center conductor overlaps unimplanted N− material.

In addition to millimeter wave Schottky diodes, fabrication of this high speed circuit requires high capacitance per unit area capacitors and low capacitance air bridge crossovers. High capacitance per unit area is needed for capacitor C1 and C2 to allow reasonably high coupling capacitance diodes while maintaining a high capacitor self-resonance frequency. The capacitor resonates when it is one quarter wave length long. To set the self-resonant frequency to ten times the highest frequency of interest ($10 \times 100$ GHz), for a 20 micrometer wide, 500 femtofarad capacitor with a silicon nitride dielectric, the dielectric thickness must be 700 angstroms. A value of 1,000 angstroms was chosen for the dielectric thickness since nitride thinner than this can have an unacceptably high density of pin hole defects. Capacitor insulation of 1,000 angstroms of nitride puts the resonant frequency at approximately 700 GHz for this structure.

Silicon nitride was chosen as the capacitor dielectric not only because of its high relative permitivity of 7.3 necessitated by the resonant frequency requirement discussed above, but also because of its excellent properties as a diffusion barrier and scratch protector. These are the same reasons that silicon nitride is the most widely used dielectric by microwave monolithic integrated circuit foundries. Choosing this dielectric in conformance with the existing industry standards also makes the sampling head circuit more practicable from the standpoint of manufacturability.

The capacitors are fabricated by depositing 1000 angstroms of 250° C. PECVD silicon nitride over the entire wafer and reactive ion etching holes, in a $C_2F_6$ plasma, where contact is to be made to underlying metal. The bottom plate of the capacitor is the Schottky metal while the top plate is 2 micrometers of plated gold. An air bridge, which is plated at the same time as the capacitor, is used to make connection to the top plate.

The last element required for millimeter wave circuits of reasonable complexity is the air bridge. The air bridge, which is a cross-over with no supporting dielectric, can be made to clear the metal that is crossing over by 1.5 micrometers. This large gap, in addition to the unity dielectric constant of air, gives the air bridge cross-over extremely low capacitive coupling to the metallization below.

The air bridges are fabricated by the process summarized earlier herein and detailed in Appendix A.

Important features of the sampler design layout are: (1) monolithic integration with processing on one side of the wafer only; (2) fifty ohm input match at the RF port; (3) no degradation in RF signal as it propagates through the sampling structure; (4) sufficient bandwidth in the local oscillator connection for the ultra short sampling pulse; (5) a reasonable match on the local oscillator port; (6) a balanced drive on the local oscillator port; and (7) an unbalanced drive on the RF port. The first requirement is the most demanding since it prohibits all previous sampling head designs. The structure detailed in FIGS. 5 through 7 to fulfill this requirement essentially consists of two intersecting coplanar transmission lines, one of which carries the local oscillator sawtooth waveform and the other of which carries the RF signal to be sampled.

The slot line differentiator also provides a naturally balanced local oscillator drive. That is, the current in the center conductor of the local oscillator coplanar waveguide is equal and opposite to the current in the outer conductor. When this current is applied to the slot line mode of the RF signal coplanar waveguide, no current is induced on the center conductor of the RF signal line. Since no current is induced on the center conductor of the RF signal line, the potential of this conductor is determined by the RF circuit and not by the local oscillator.

When the intermediate pulses from the nonlinear transmission line are applied to the RF slot line, the initial impedance is that of the RF slot line in parallel with the sampling diodes, all in series with the 50 ohm local oscillator coplanar waveguide terminating resistance 110 in FIG. 5. To get the majority of the RF voltage to develop across the diodes instead of the terminating resistor 110, the RF slot line impedance must be as large as possible. To achieve the high impedance slot line segments, the RF ground planes must be separated by a significant fraction of the substrate thickness. To maintain the RF coplanar waveguide impedance at 50 ohms, the RF center conductor must also be made larger to keep the same center conductor to slot width ratio. This is another reason for the hour glass configuration of the center conductors 80 and the ground planes 82 and 84 shown in FIG. 5. Scale modeling of the invention showed that a slot width on the RF slot line which is ⅜ of the substrate thickness yields a slot line impedance of 78 ohms. Microwave simulations on SPICE indicate that this would be large enough to permit sufficient voltage to develop across the diodes. The requirement of the high impedance slot line mode in addition to the necessity of keeping the diode sampling loop short, results in the hour glass shape of the RF coplanar waveguide and keeps the RF coplanar waveguide at a characteristic impedance of 50 ohms.

A fundamental difficulty in making a sampling head with a bandwidth of 100 GHz or greater is to lay out the circuit in such a way that parasitic elements are eliminated or incorporated into the design. Any element that cannot be treated as a distributed structure must be kept much less than a wave length long at 100 GHz. In gallium arsenide, this means all lumped elements must be less than 100 micrometers in their longest dimension. This requirement is easily met by the 2×5 micrometer sampling diode junction areas. However, it is desirable that the entire local oscillator circuit loop meet the 100 micrometer design rule to minimize inductance in this critical path. To accomplish this, minimum design rules were used to pack the elements as close together as possible. The thick Schottky metal lift-off process described earlier allows two micrometer lines and three micrometer spaces. When packed together, the local oscillator loop including the local oscillator terminating resistor 110, the two sample capacitors and the two sampling diodes measured 104 micrometers in perimeter.

NONLINEAR TRANSMISSION LINE DETAILED DESCRIPTION

Figure 9:
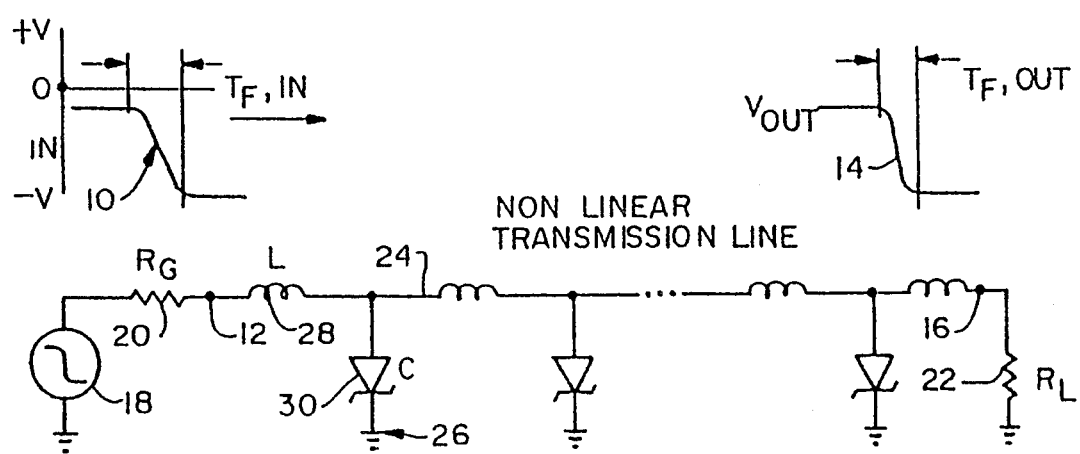
FIG. 9 is schematic diagram of a nonlinear transmission line.

Referring to FIG. 9 there is shown a schematic diagram of a nonlinear transmission line. This transmission line will change the shape of an input signal shown generally at 10 and applied to an input terminal 12 to the output signal shown at 14 appearing at an output terminal 16. In the process of propagating from the input terminal 12 to the output terminal 16, the fall time of the signal 10 is reduced from the time $T_{f,in}$ to the fall time of the output signal equal to $T_{f,out}$. The input signal 10 is supplied by a signal generator 18 through a source resistance 20. The output signal 14 is applied to a load resistance 22.

The nonlinear transmission line between input terminal 12 and output terminal 16 is comprised of a plurality of segments. Each segment is comprised of an inductor L and a capacitor C. In the preferred embodiment, the inductance is implemented through short sections of transmission line marked XX in FIG. 12. These short sections of transmission line have a characteristic impedance $Z_1$ and have a length in units of time which is designated in the equations of Appendix B as the Greek letter tau. Each capacitor takes the form of a varactor diode junction in the preferred embodiment. The capacitor in each section couples the center conductor 24 of the transmission line to a ground plane shown generally at 26. Thus, the first section of the nonlinear transmission line of FIG. 9 is comprised of the inductor 28 and the varactor diode 30 having its anode coupled to the conductor 24 and having its cathode coupled to the ground plane 26. The conductor 24 serves as the center conductor. The varactor diode 30 has a PN junction therein which has a transition capacitance. The transition capacitance results when the junction is reverse biased and a depletion region is formed as will be explained in more detail below. The transition capacitance is actually the change in uncovered charges of the depletion region as the voltage changes, but for discussion purposes the reader can visualize the capacitor as having two movable, conductive plates. These two conductive "plates" are separated by the depletion region when the diode junction is reversed biased. For completeness here, the transition capacitance and depletion region will be explained briefly so that the nonlinearity of the transmission line can be understood by the reader. To do this requires reference to a cross-section of the diode region.

Figure 10:
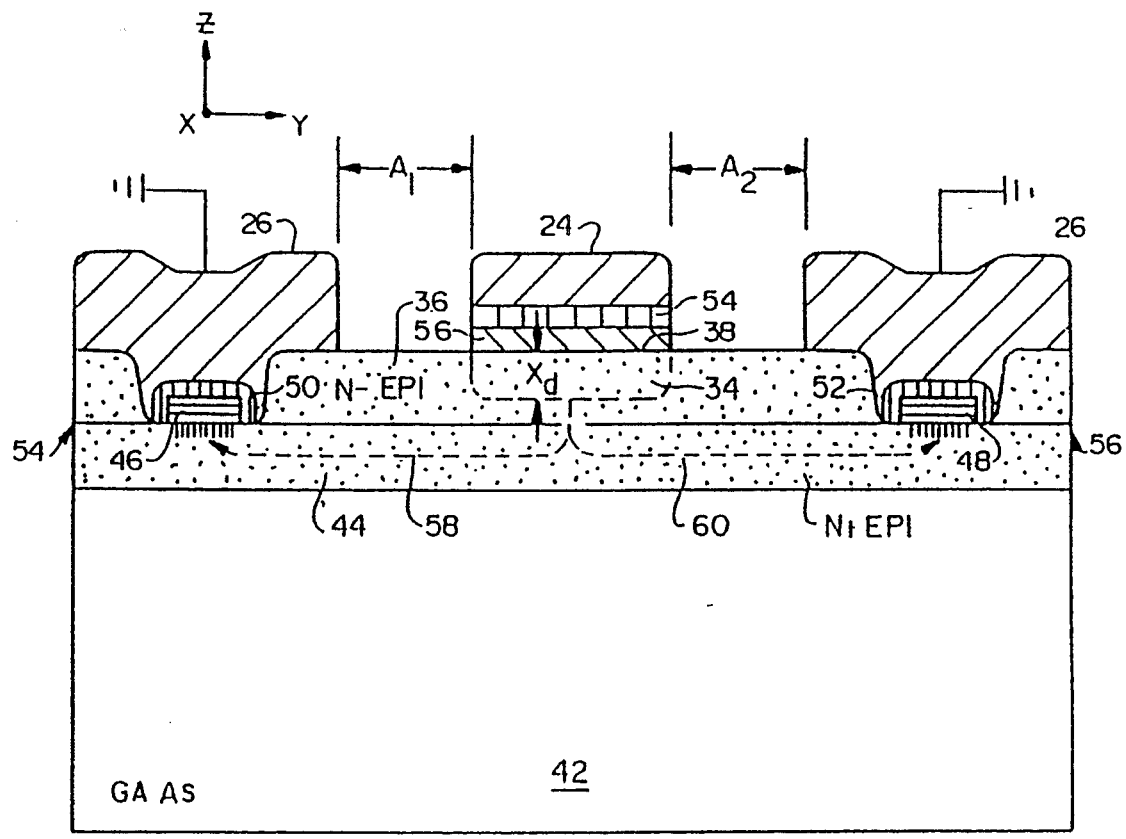
FIG. 10 is a cross-sectional view of the structure of a coplanar waveguide (CPW) nonlinear transmission line taken through a diode isolation island.

Referring to FIG. 10 there is shown a cross-section of the transmission line at a location which shows the construction of one of the varactor diodes according to one embodiment. FIG. 10 will be explained in much greater detail below during the discussion of the features of the transmission line. For now, the reader's attention is directed to a Schottky contact (diode junction) 38, a depletion region 34 and a $N^-$ doped epitaxial layer 36 and an $N^+$ doped epitaxial layer 44. These three components along with ohmic contacts 46 and 48 form a Schottky diode. The dotted line defining the bounds of the depletion region 34 represents the extent of the depletion region into the $N^-$ epitaxial layer 36 at a particular voltage level of reverse-bias on the Schottky diode junction. This depletion region 34 represents a volume of uncovered, immobile charges bonded in the $N^-$ epitaxial gallium arsenide crystal lattice caused by the reverse-bias voltage. That is, the reverse-bias voltage causes mobile majority carriers donated by the dopants in the $N^-$ epitaxial layer 36 to move away from the junction 38. In $N^-$ material, these majority carriers are free electrons that are loosely bound to the nuclei of the N-type impurity atoms which have been added to the crystal lattice. When these mobile carriers move away from their nuclei under the influence of the negative potential applied to the anode of the diode, they leave uncovered the nuclei of the dopant atoms. These dopant atoms have one more proton than electron because of the movement of the electrons away from the junction, and thus represent immobile positive charges making up the depletion region 34. The dimension $x_d$ represents the depletion region width. This dimension increases with increased reverse-bias voltage. Schottky contact 38 is the anode of the diode, and the $N^-$ epitaxial layer 36 is the cathode of the diode. When a negative voltage is applied to the anode relative to the cathode, the diode is reverse-biased and the depletion region 34 is formed. If the level of reverse-bias voltage is increased, the dimension $x_d$ increases as more electrons are pushed away from the junction and more positive charges are uncovered. This process of uncovering charges represents the process of changing charge storage as voltage changes, which is the essence of a capacitor. This increase in uncovered charge with increases in applied voltage may be considered to be a capacitive effect. This capacitance is the transition capacitance which will hereafter be denoted $C_j(v)$. The magnitude of the transition capacitance is equal to the change in charge within the depletion region divided by the change in voltage which caused that change in charge. This capacitance is variously referred to in the literature as the transition region, space charge region, barrier region or depletion region capacitance. Because the depth of the depletion region 34 increases as V becomes more negative, the transition capacitance decreases with more negative voltages V.

The amount of change in the dimension $x_d$ with the change in reverse-bias voltage depends upon the doping of the $N^-$ epitaxial layer 36. Lighter doping leads to greater changes in the width of the depletion region for a given change in the reverse-bias voltage.

Referring again to FIG. 9, what this change in the transition capacitance means in terms of the operation of the nonlinear transmission line is as follows. As the input signal 10 propagates along the transmission line, the instantaneous voltage at the anode of each diode changes over time. The input signal is applied with such a polarity relative to ground, that all diodes are reverse-biased. As the reverse-bias voltage on each anode changes, so does the transition capacitance magnitude.

There is a total capacitance per section of line which is the combination of a fixed capacitance from the interconnecting line sections XX in FIG. 12 which is not voltage dependent and the transition capacitance which is voltage dependent. Thus, the total capacitance per section of line is voltage dependent.

Many characteristics of the transmission line depend upon the transmission line capacitance per section. Where the capacitance per section is voltage dependent, so are these parameters. For example, the characteristic impedance of the line, the group delay and the group velocity of the line are all voltage dependent.

Precisely speaking, the mathematical relationship between the characteristic impedance and the voltage-dependent total capacitance per section of the line (denoted $C_T(v)$) is given in Equation 1 of Appendix B. The relationship between the group delay and the voltage dependent total capacitance per section of line is given in Equation 5 of Appendix B. The other equations of Appendix B define various other relationships of interest in considering the characteristics of a nonlinear transmission line. Equation 4 of Appendix B defines the precise mathematical relationship between the capacitance of a step junction diode and the voltage applied to that junction to reverse bias it. Equations 6 and 7 of Appendix B give the relationships between the periodic structure cutoff frequency $w_{per}$ and the diode cutoff frequency $w_{rc}$ and the voltage dependent capacitance per section, the line inductance per section and the series resistance of the diodes. Generally, the higher these cutoff frequencies are, the shorter the falltime which can be achieved at the output of the line.

Figure 11A:
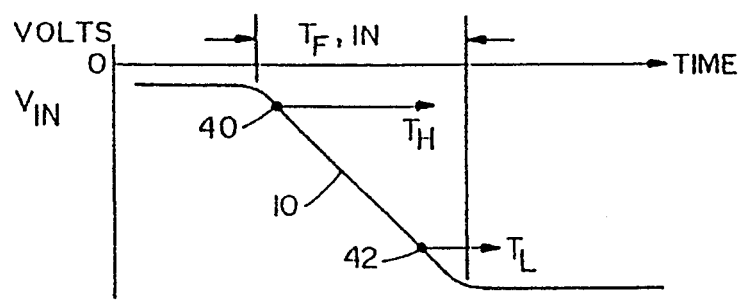
FIGS. 11(A) and 11(B) are diagrams of the input signal and the output signal from the nonlinear transmission line showing the results of the compression.
Figure 11B:
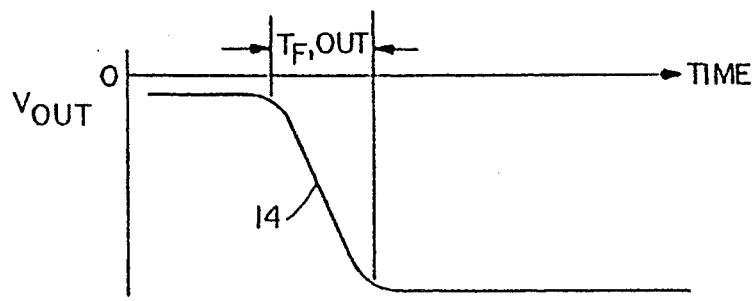

It is the voltage dependence of the group velocity which results in compression of the fall time of electrical wave fronts as they propagate along such a nonlinear transmission line. This compression can be understood by reference to FIG. 11. FIG. 11 shows the input signal 40 labeled $V_{IN}$ in part A and the output voltage labeled $V_{OUT}$ in part B. The fall time of the input signal is labeled $T_{f,in}$. The fall time of the output signal is labeled $T_{f,out}$. Note that the fall time of the output signal is substantially shorter than the fall time of the input signal because of the compression which occurred during propagation down the line. The reason for this compression is that the points on the input voltage waveform having more negative voltages travel at higher speeds and experience less delay in a nonlinear transmission line than points on the voltage waveform having more positive voltages. This is because of the voltage dependence of the line capacitance and the relationship between the line capacitance and the group delay. This phenomenon is symbolized in FIG. 11A by the delay vector labeled $T_H$ for the point 40 on the input voltage wave form being longer than the delay vector labeled $T_L$ for the point 42 which is lower on the voltage waveform. Every point on the voltage waveform has a different speed of propagation, and hence a different delay through the line. Because the higher voltage points are traveling faster and have less delay than the lower voltage points, the "tops catch up with the bottoms" and the waveform changes shape and assumes the shape of the output waveform known at FIG. 11B. The result is that the fall time is compressed as seen by the substantially shorter duration of $T_{f,out}$ in FIG. 11B, compared to $T_{f,in}$, in FIG. 11A. The reasons why higher voltage points have faster speeds of propagation are described in Appendix B and are well understood by those skilled in the art and no further details will be given here.

Referring to FIG. 12 there is shown a plan view of the nonlinear transmission line according to the preferred embodiment of the nonlinear transmission line. The structural details of the transmission line can best be understood by joint reference to FIGS. 10, 12, 13 and 14. FIG. 10 shows a cross-section of one of the diodes in the transmission line taken at section line 10—10' in FIG. 12 according to one process of fabricating the line. The transmission line is fabricated on a monolithic gallium arsenide substrate 42. This substrate has formed thereon an N+ epitaxial layer 44 and an N− epitaxial layer 36 formed on top of the epitaxial layer 44. In FIG. 12, only a portion of these epitaxial layers is visible between the ground plane metal contacts 26 and the center metal contact 24. This epitaxial layer portion is labeled 36/44. The two parallel metal conductors 24 and 26 form the inductive portions of the transmission line. The center conductor 24 also forms the anode contact of the Schottky diodes. The ground plane contact 26 is also the cathode contact of the Schottky diodes. These cathode contacts are implemented with ohmic contacts to the N+ epitaxial layer 44 as best shown in FIG. 10.

The ohmic contacts 46 and 48 are formed by alloying a gold germanium mixture at high temperatures as is well known in the art. Any ohmic contact alloy will work to form the contacts 46 and 48, but it is preferred to use an alloy and a technique which will create the lowest possible contact resistance for reasons which will be explained more fully below. In the preferred embodiment, the ohmic contacts 46 and 48 are formed by heating a mixture of 8% gold and 12% germanium so as to cause the germanium to diffuse into the N+ epitaxial layer 44 to form a low resistance contact. The ground plane metal contact 26 and the center anode contact 24 are each comprised of gold. Two diffusion barrier layers 50 and 52 in the ohmic contact structure prevent the gold from the ground plane conductor 26 from diffusing into the ohmic contact regions 46 and 48 or the N+ epitaxial layer below it. This prevents spiking of gold through the N+ epitaxial layer 44 to the substrate 42. Preferably, the metal/dopant alloy chosen for the ohmic contacts will have as low a melting point as possible. Other nonalloyed contact structures may also be used if spiking of the gold through to the substrate 42 can be prevented. It is important, however, for the contact structure chosen to have a low series resistance so as to maintain the diode cutoff frequency as high as possible.

The diode-anode contacts are formed by the gold layer 24 on top of a platinum diffusion barrier 54. The platinum diffusion barrier separates the gold layer 24 from the Schottky contact metal 56 and prevents the gold layer 24 from spiking through the Schottky junction to the buried layer 44 and shorting the diode. The Schottky contact metal layer 56 is titanium in the preferred embodiment. However, many other metals may be used for the Schottky contact metal layer 56. Basically, any metal that will form a Schottky diode may be used. Such metals include aluminum, molybdenum, chromium and alloys such as molybdenum/aluminum and titanium/tungsten. The desired qualities for the metal layer 56 are that it exhibit good adhesion to the gallium arsenide substrate and that the diffusion of the metal into the gallium arsenide be low during high temperatures of operation or during subsequent processing steps. It is also desirable that the material chosen for metal 56 be stable in the sense that it should not change the leakage current through the diode with aging, changing temperature and so on. For further information, see page 271 of the text on gallium arsenide processing incorporated by reference herein.

The liftoff process for forming the diode anode contact 56/54/24 is well known in the art of semiconductor processing and is described in more detail at page 145 in "Gallium Arsenide Processing Techniques" incorporated by reference herein. For completeness here, a short summary of the process will be given. In the area where metal is to be placed on the substrate, a layer of photoresist which has been spun onto the wafer is exposed to light through a mask. All other areas are shaded by the mask. The layer of photoresist is then hardened at the surface by a chlorobenzene soak before being developed. This renders the surface farthest away from the gallium arsenide harder than the regions closer to the substrate. The layer of photoresist is then developed. Because the developer carries away material closer to the substrate faster than the harder material farther away from the substrate, the area of photoresist exposed to the light is carried away and forms a hole with inwardly tapered edges. Then the desired metal is evaporated onto the surface of the substrate in the hole in the photoresist and onto the surface of the photoresist itself. Thereafter, the photoresist is dissolved thereby carrying away the metal on top of the photoresist and leaving the metal in the hole in the photoresist layer attached to the substrate there. This process is used to form the diode anode contact, the final interconnect metallization, and the ohmic contacts. It is also used to form the implant mask except that a layer of polyimide is placed under the layer of photoresist such that the metal in the hole in the photoresist is formed on top of a layer of polyimide. After the metal liftoff, the metal in the hole lies on top of a layer of polyimide covering the whole wafer. The wafer is then immersed in commercially available polyimide solvent to dissolve all the polyimide except that portion of the layer under the metal. The resulting metal/polyimide sandwich acts as an implant mask during the proton isolation implant.

Other gate technologies could also be used to form the Schottky diode anode contact. Some of these other gate technologies may have reduced reliability over time when subjected to high temperatures.

The doping of the N$^-$ epitaxial layer 36 is $3 \times 10^{16}$ N$_D$ atoms/cm$^3$. The doping of the N$^+$ epitaxial layer in the preferred embodiment is $3 \times 10^{18}$ N$_D$ atoms/cm$^3$.

The Schottky diodes are formed by isolating the epitaxial layers so that there are periodically spaced, isolated islands of epitaxial layers 36 and 44 which have mobile charge carriers therein. An implant is used at all other areas to cause crystal damage in the epitaxial layers 36 and 44 to immobilize the charge carriers, thereby converting the epitaxial layers in these implanted regions back to what is essentially intrinsic, high resistivity gallium arsenide. This crystal damage region is shown as the speckled pattern in the epitaxial layers 36 and 44 at 54 and 56 in FIG. 10. In FIG. 13 viewing above the plane of the nonlinear transmission line, the crystal damage region includes the entire area of the devices except for the masked regions 62 in which the diodes are formed. Outside the masked (unimplanted) regions 62, the implantation converts the N$^-$ and N$^+$ layers into semi-insulating material, thus restricting the Schottky contact area 38 to within the unimplanted region 62. These isolation regions restrict the current path to the dotted lines shown passing through the N$^-$ epitaxial layer 36 and the N$^+$ epitaxial layer 44 from the depletion region to the ohmic contacts. These current paths are designated 58 and 60 in FIG. 10.

A plan view of the boundary of the isolation island for each Schottky diode is illustrated in FIG. 13. In FIG. 13, the dashed lines represent the outline of the metal contacts 24 and 26, while the solid line 62 represents the boundary of the isolation implant. All area within the solid line 62 is not implanted. Thus, the charge carriers in the epitaxial layers 36 and 44 within this perimeter will be free to move.

Referring to FIG. 14 there is shown a plan view of the area of a typical diode. The dashed lines 64 and 66 define the perimeters of the ohmic contacts 46 and 48. The region 38 defined by the intersection of the areas of the central metal contact 24 and the isolation island 62 defines the junction area of the Schottky diode.

The dimension P in FIG. 12 defines the pitch or periodicity of the diodes. In the preferred embodiment, the pitch is 160 microns. Ten micron design rules are used in the preferred embodiment, which means that the junction area 38 in FIG. 14 of the diode is 10 microns $\times$ 10 microns. This also means that the space between the center conductor 24 and the ground plane conductors 26 is also 10 microns. Smaller junction areas and closer spacing will improve the performance of the device for reasons which will be explained in more detail below.

The minimum compressed fall time $T_{f,min}$ is set predominantly by the periodic line cutoff frequency and the varactor diode RC cutoff frequency $w_{rc}$. The expressions for these two cutoff frequencies are given by Equations 6 and 7 of Appendix C. With monolithic fabrication of the transmission line on gallium arsenide substrates, these two cutoff frequencies can be on the order of 0.1-1 terrahertz. This permits obtaining compressed fall times on the order of 5-10 picoseconds with 10 micron design rules. In the preferred embodiment, the integrated nonlinear transmission line incorporates 42 diodes. Each of these diodes has a junction potential phi of approximately 0.8 volts and $C_{jo}$ of approximately 50 femtofarads at 160 micron spacing (tau=1.4 picoseconds) along a 90 ohm coplanar waveguide transmission line. This results in a 140 gigahertz periodic line cutoff frequency. By calculation, the characteristic impedance $Z_o(v)$ varies from 44–55 ohms, and the group delay $T(v)$ changes by 25 picoseconds as the line voltage varies from 0 to $-2$ volts.

In FIG. 10, the N$^-$ epitaxial layer 36 is 0.6 microns thick in the Z direction. The N$^+$ epitaxial layer 44 is 0.8 microns thick in the Z direction in the preferred embodiment.

The current in the diodes travels from the anodes to the cathodes along the paths 58 and 60 in FIG. 10. There is a series resistance associated with the current paths 58 and 60 which is the series resistance of the diode which limits the diode cutoff frequency $w_{rc}$. This series resistance can be divided into three components. The first component is the resistance of the current path in the portion of the N$^-$ epitaxial layer 36 from the bottom of the depletion region 34 to the junction with the N$^+$ epitaxial layer 44. This component of resistance accounts for approximately 20% of the total series resistance, and varies as the depth of the depletion region 34 varies with voltage. The second component of the resistance is the component attributed to the flow of the current through the N$^+$ epitaxial layer 44 to the positions of the ohmic contacts 46 and 48. This component accounts for approximately 60% of the total series resistance. The remaining 20% of the total series resistance is attributed to the resistance of the ohmic contacts 46 and 48. Obviously, closer spacing of the ground plane contacts 26 to the center contacts 24 will decrease the total path length and the total series resistance. Also, improvement of the ohmic contacts series resistance will raise the diode cutoff frequency.

Figure 18:
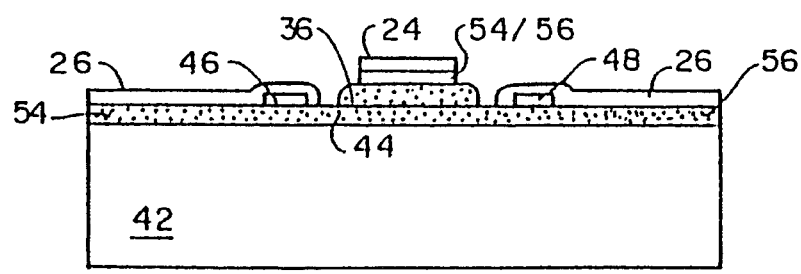
FIG. 18 is a cross-sectional view of another embodiment of the CPW nonlinear transmission line through the diode area.

The N+ epitaxial layer 44 also provides a resistive connection between the two coplanar waveguide ground planes labeled as metallic contacts 26 in FIG. 18. This resistive connection suppresses propagation of an undesired unbalanced "slot-line" mode on the transmission line.

Fabrication of the device of FIG. 10 is performed in the following manner. Fabrication starts with an undoped gallium arsenide substrate which has a sufficient length to get a sufficient number of sections of the transmission line to achieve the desired degree of compression. In the preferred embodiment, 42 diodes are used at 160 micron center to center spacing. The minimum number of diodes required in the line is approximately 20% larger than the quantity equal to the falltime of the input signal ($T_{f,in}$) divided by the difference in delay between the highest voltage point and the lowest voltage point of the waveform. This delay is given by Equation 5 of Appendix C. The factor of 20% is necessary because compression to the final, shortest falltime is approached asymptotically.

The first actual process step is to grow the two epitaxial layers 36 and 44. In the preferred embodiment, these layers are grown by molecular beam epitaxy to the thicknesses cited above. Any other epitaxial method will also work to grow these layers. For example, liquid or vapor phase epitaxy will work as well as MOCVD which stands for metal organic chemical vapor deposition. Methods of performing this process and other process steps described herein are described in more detail in "Gallium Arsenide Processing Techniques" by Ralph Williams, ISBN 0-89006-152-1 (Artech House, Inc. 1984) which is hereby incorporated by reference.

The epitaxial layers are doped as they are formed to have uniform doping profiles with the doping levels given herein. It is not believed that diffusion can be used to dope the epitaxial layers since it would not be possible to dope the epitaxial layer 44 heavily without leaving a doping level in the epitaxial layer 36 which is too high.

Next, the two ohmic contacts 46 and 48 are formed having 0.06 ohms/mm resistivity. These contacts are formed using a 0.75 um recessed etch, a self-aligned (88% gold-12% germanium)/nickel/gold liftoff technique, and a 450° C. alloy or a 12 second rapid thermal anneal. The rapid thermal anneal process is preferred since lower contact resistance can be achieved.

Figure 15:
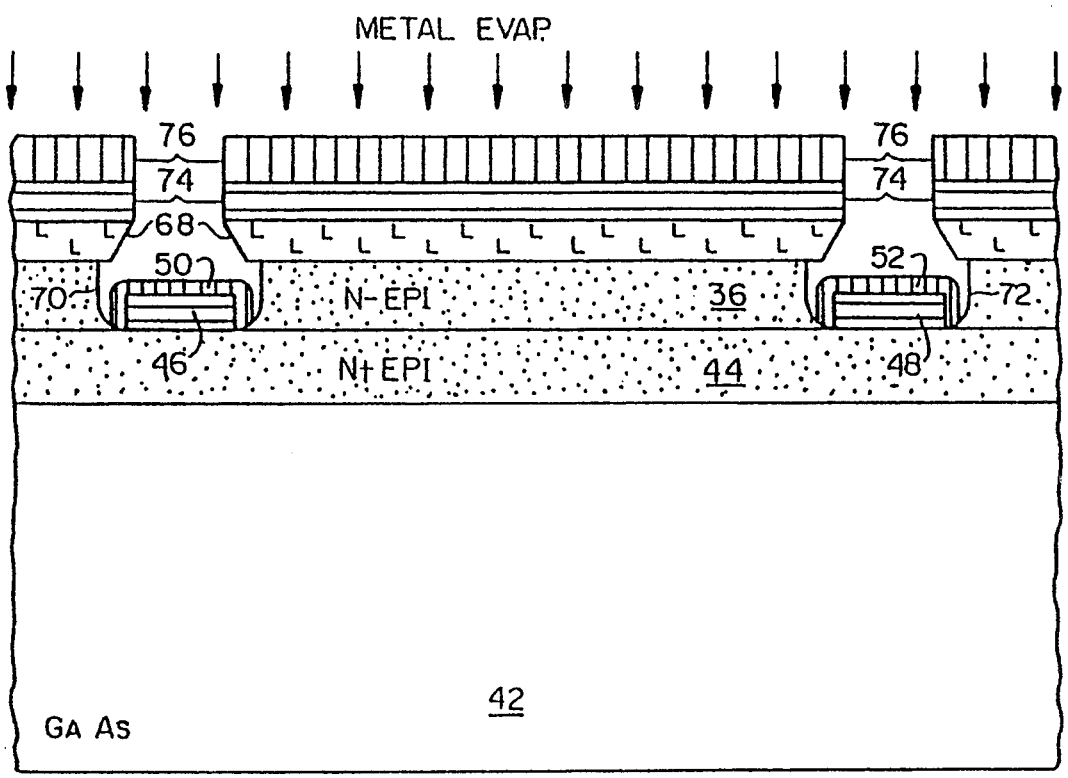
FIG. 15 is a cross-sectional view of the structure of the CPW nonlinear transmission line during an intermediate stage of device construction during formation of the ohmic contacts.

FIG. 15 shows the state of the wafer after formation of the two epitaxial layers 36 and 44 and after deposition of the ohmic contact metals and just prior to the liftoff. The layer of photoresist 68 represents the configuration of the first mask level. The contact holes 70 and 72 are etched using the photoresist layer 68 as the etch mask. This etch is performed using a wet chemical etch because of the 10 micron design rules. If 2 micron design rules are used, in alternative embodiments, the etch step to form the contact hole 70 and 72 may be performed using a plasma etch. After the contact holes are etched through the N− epitaxial layer 36, a conventional metal evaporation step is performed. This metal evaporation step uses the photoresist layer 68 to protect all layers of the N− epitaxial layer 36 except the areas where the contact holes 70 and 72 are formed. To do this, the wafer is placed in a chamber which is pumped down to a high vacuum level. Then a high energy electron beam is directed at a crucible filled with a gold-germanium mixture comprised of the desired alloy. The electron beam evaporates portions of this mixture in the center of the crucible causing gold and germanium atoms in the prescribed proportion to be deposited as the first layer of the ohmic contacts labeled 46 and 48 in FIG. 15 and as the layer 74 on top of the photoresist layer 68. After this layer has been deposited, the gold-germanium target crucible is rotated out of the path of the electron beam and a crucible containing nickel is rotated into the path of the beam. The high energy electron beam then evaporates portions of the nickel in the target crucible causing nickel atoms to be deposited on top of the previously deposited gold-germanium layer. This nickel layer is labeled 50 and 52 in the positions of the ohmic contacts and 76 on top of the layer 74.

After these two metal layers are deposited, the photoresist layer 68 is dissolved in a chemical bath thereby removing the metal layer 74 and 76. In some embodiments, a further layer of gold (not shown) is evaporated on top of the nickel layers 50 and 52 prior to removal of the photoresist layer 68. In these embodiments, the photoresist layer 68 is removed after this gold layer is deposited. The entire structure then is subjected to a 450° C. alloy process in a diffusion furnace for 30 seconds or for 12 seconds in a rapid thermal anneal device. During this high temperature step, germanium atoms in the metal layers 46 and 48 diffuse into the N+ epitaxial layer 44, thereby forming a low resistance ohmic contact. During this high temperature step, the nickel layers 50 and 52 act as diffusion barriers to prevent gold deposited on top of the nickel from diffusing into the gold germanium layers 46 and 48. This also prevents the gold from diffusing into the epitaxial layer 44 and "spiking" through to the gallium arsenide substrate 42.

Figure 16:
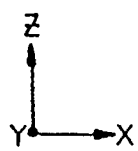
FIG. 16 is a cross-sectional view of the structure of the CPW device during the isolation implantation.
Figure 16:
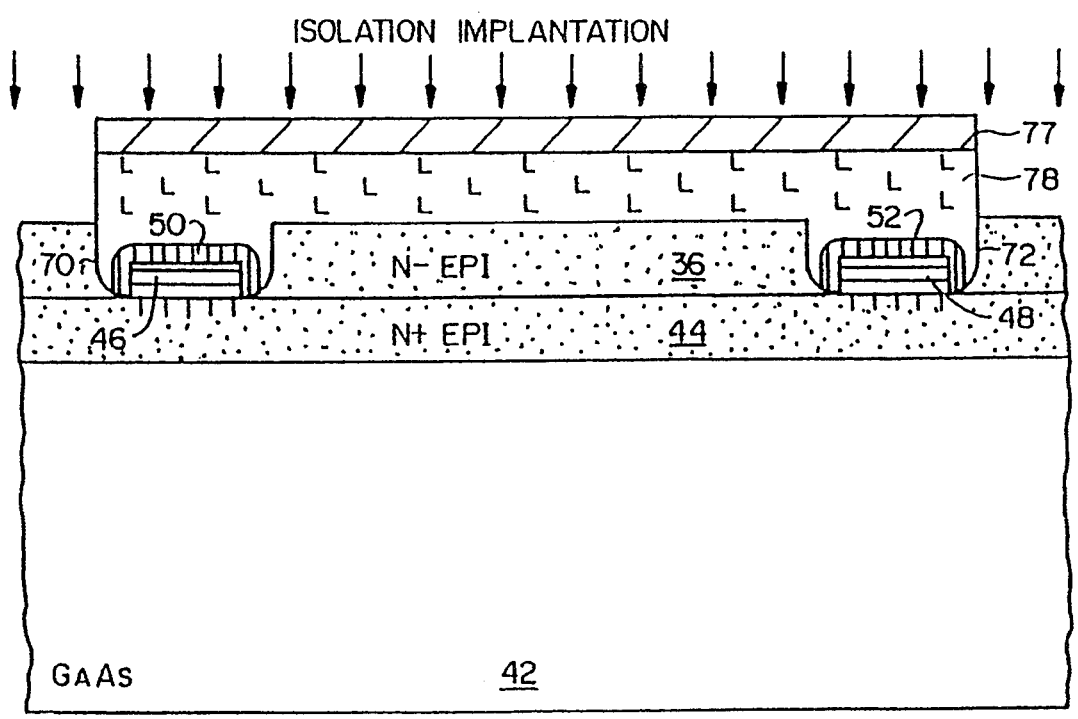

The next step is a proton implantation for the purpose of defining the isolation islands in which the Schottky diodes will be formed. FIG. 16 shows the proton implantation step and the configuration of the gold 77/polyimide 78 implantation mask which defines the boundaries of the isolation island. The implantation mask 77/78 has a configuration from the plan view, i.e., looking down the Z axis, as shown in FIG. 13. The purpose of the isolation implantation has been previously described. Only the portions of the epitaxial layers 36 and 44 lying underneath the implantation mask 77/78 will be able to conduct current freely after the implantation step has been performed. In the preferred embodiment, the implantation is done using protons since protons are relatively easy to implant to the necessary depth into gallium-arsenide at energy levels around 190 KEV. However, some equipment having greater acceleration energies is available to implant other types of ions such as oxygen or boron to the necessary depth. Any such implantation which causes the above described crystal damage result will suffice for purposes of practicing the invention. In the preferred embodiment, the proton implantation is done in two steps. The first step is an implant at 190 KEV with a dosage level of $6 \times 10^{14}$/sq. cm. The second step is a 160 KEV implant with a dosage level of $1.5 \times 10^{14}$/sq. cm. These implants provide a greater than 40 megohm/sq. isolation characteristic. The isolation mask 77/78 is comprised of 1.6 micrometers of gold shown at 77 and 1.4 micrometers of polyimide 78 overlying the ohmic contacts and the region 62 which will become the diode-active region.

The final process step is to perform a third mask level photolithography step to define by liftoff techniques the locations of the Schottky anode contacts 24 in FIG. 10 and the configuration of the ground plane metal contacts 26. After the resulting photoresist layer is developed, metal evaporation is used to deposit 0.1 microns of titanium as shown at 56 in FIG. 10. After the titanium is deposited, the titanium crucible is rotated out of the way and a platinum crucible is rotated into the target position. The high energy electron beam then is applied to evaporate a portion of the platinum in the center of the crucible to deposit a 0.1 micron platinum diffusion barrier shown at 54 in FIG. 10. Finally, the platinum crucible is rotated out of the way and a gold target crucible is rotated into the target position. The third evaporation step is then performed to deposit a 1.4 micron thick (Z direction) gold contact 24 and to form the gold ground plane contacts 26 and transmission line conductors 24. In some embodiments, the ground plane contacts 26 and transmission line conductors 24 may be formed separately with a fourth masking level. Schottky diodes are formed in a 10 micron by 10 micron region underlying the titanium layer 56 in each isolation island by the self aligned intersection of the titanium metal deposition and the isolation island. This completes the fabrication of the device.

With a nonlinear transmission line of the structure of FIGS. 10 and 12, it is possible to configure the dimensions of the structure to obtain compressed fall times which are short enough to generate gate impulses of approximately 5 picosecond duration or better. Such a gate impulse can be obtained by differentiating the output step transition after compression in a nonlinear transmission line of the structure of FIGS. 10 and 12. The band width of diode sampling bridges used in sampling oscilloscopes and network analyzers is primarily limited by the duration of the pulse gating the diode. With gating pulses having approximately 5 picoseconds duration, the bandwidth of 2 diode sampling bridges for sampling oscilloscopes could be extended from the current 20 gigahertz level to 100 gigahertz.

One of the factors which limits the shortest falltimes which are available from a nonlinear transmission line of the structure shown in FIGS. 10 and 12 is the cutoff frequency for the Schottky varactor diodes. This cutoff frequency, is defined by Equation 7 of Appendix C. Another factor which limits the amount of compression is the cutoff frequency of the periodic structure. This cutoff frequency is defined by Equation 6 of Appendix C. With the configuration of the nonlinear transmission line of FIGS. 10 and 12 and with some scaling of the structural dimensions using more stringent design rules, it is possible to obtain step functions with the falltimes of approximately 4 picoseconds. This is a factor of 6 improvement over the rise times which can be currently attained by electrical means. With further improvements in the process and with tighter design rules, it is possible to obtain subpicosecond rise times.

What is the relationship between the physical dimensions of the structure shown in FIGS. 10 and 12 to the amount of compression which can be obtained? As a step input signal $V_{in}(t)$ with initial voltage $v_h$, final voltage $v_l$, and fall time $T_{f,in}$, propagates along the line, the fall time will at first decrease linearly with distance. As the pulse fall time decreases, dispersion arising from the structure's cutoff frequency, $w_c$, competes with the compression arising from the voltage-dependent propagation velocity. A final limited fall time $T_{f,min}$, on the order of, but longer than $2.2/w_c$, is reached at which the edge compression per section due to line nonlinearity is equal to the edge broadening per section due to line dispersion. The output fall time is given by Equation 8 of Appendix C. $T_{f,min}$ in Equation 8 varies inversely with both the diode cutoff frequency $w_{rc}$ given by Equation 7 and the periodic cutoff frequency $w_{per}$ given by Equation 6. Exact calculation of $T_{f,min}$ requires computer simulation.

Line periodicity of the diode structure introduces a cutoff frequency $w_{per}$ which is given by the implicit relationship of Equation 9 of Appendix B which is simplified to Equation 6 of Appendix B. The term $C_{ls}$ in Equation 9 is the varactor's large signal capacitance and is defined by Equation 10 of Appendix B.

For input signals $V_{in}(t)$ such that at all points on the line the propagating wave is of sufficiently long rise time, the output of the transmission line is given by Equation 11 of Appendix B. This equation shows that the compression occurs because of the voltage dependence of the propagation velocity signal along the line as shown by the relationship between equations 11 and 5.

The performance of the line can be improved by increasing the periodic cutoff frequency $w_{per}$. This can be done by decreasing the diode spacing (in units of tau). However, decreasing tau (decreasing pitch) will also decrease the small signal characteristic impedance given by Equation 1 of Appendix B and will also decrease the large signal characteristic impedance given by Equation 12 of Appendix B because of the decrease in inductance per section (given by Equation 1 of Appendix B) where the characteristic impedance of the line is defined by Equation 12 of Appendix B. This is an undesirable result for the power transfer efficiency reasons noted above. Therefore, the large signal characteristic impedance $Z_{ls}$ given by Equation 12 in Appendix B will be constrained to approximately 50 ohms. Other embodiments may use different characteristic impedances for specific applications. However, the preferred embodiment will have a characteristic impedance of approximately 50 ohms. Accordingly, to satisfy this constraint while decreasing the diode spacing tau, the large signal varactor capacitance $C_{ls}$ must also be scaled in proportion with the scaling of L, the transmission line inductance per section. In such a case, the periodic cutoff frequency $w_{per}$ is limited by lithographic constraints on the minimum junction area for the varactor.

The varactor series resistance $r_s$ introduces a varactor cutoff frequency of $w_{rc}$. If this cutoff frequency is much less than the periodic cutoff frequency $w_{per}$, this varactor cutoff frequency limits the compressed rise time to approximately $2.2\, r_s C_{ls}$. This time constant is the fundamental limitation to the compressed fall time, assuming elimination of the periodic line cutoff frequency $w_{per}$. Of course, neither cutoff frequency can be eliminated in reality so both effects must be taken into account.

The total circuit area of the structure shown in FIGS. 10 and 12 with 10 micron design rules and 160 micron diode spacing along a 90 ohm coplanar wave guide transmission line is approximately 8 mm by 0.3 mm. With a periodic line cutoff frequency of approximately 140 gigahertz, the minimum compressed fall time of 4 pico seconds can be obtained if the diode resistance is zero. With 10 ohm diode resistance, minimum compressed falltimes of 7.5 picoseconds can be obtained.

To generate subpicosecond pulses with a nonlinear transmission line, both the line periodicity cutoff frequency $w_{per}$ and the varactor cutoff frequency $w_{rc}$ must be increased. Because of the constraints on line impedance in the preferred embodiment of 50 ohms or thereabouts, diode spacing (L) must scale with diode junction area ($C_{j(v)}$). To decrease the diode capacitance and increase $w_{per}$, either the device-active layer doping must be decreased below $3 \times 10^{16}$ atoms/cm$^3$ or the junction area must be decreased below the 10 micron by 10 micron area described herein. Because of degraded diode cutoff frequency and because of rapid increases in the depletion layer width, $x_d$ in FIG. 10, with decreases in the doping of the N$^-$ epitaxial layer 36 requiring much thicker N-layers to avoid possible punch through, capacitance reduction through reduction in the junction area is the more desirable of the two approaches.

Increased varactor cutoff frequency $w_{rc}$ can be achieved by decreasing diode series resistance $r_s$. This can be achieved by reducing the spacing of the ohmic and Schottky contacts. In FIG. 10, decreased contact spacing would translate to smaller dimensions A$_1$ and A$_2$. This would decrease the length of the current paths 58 and 60 thereby reducing the series resistance. Further improvements in the series resistance can be made by selecting the ohmic contact material in process so as to minimize the series resistance presented by the ohmic contacts 46 and 48, by heavier doping of the N+ epitaxial layer 44, and by optimization of the thickness of the N$^-$ epitaxial layer 36 to the maximum possible depletion layer width $x_d$. That is, the thickness of the epitaxial layer 36 should be made as close as possible to the maximum penetration of the depletion layer 34 into the N$^-$ epitaxial layer 36. This minimizes the current path segment from the edge of the depletion layer 34 to the junction 54 between the epitaxial layer 36 and the epitaxial layer 44.

Figure 17:
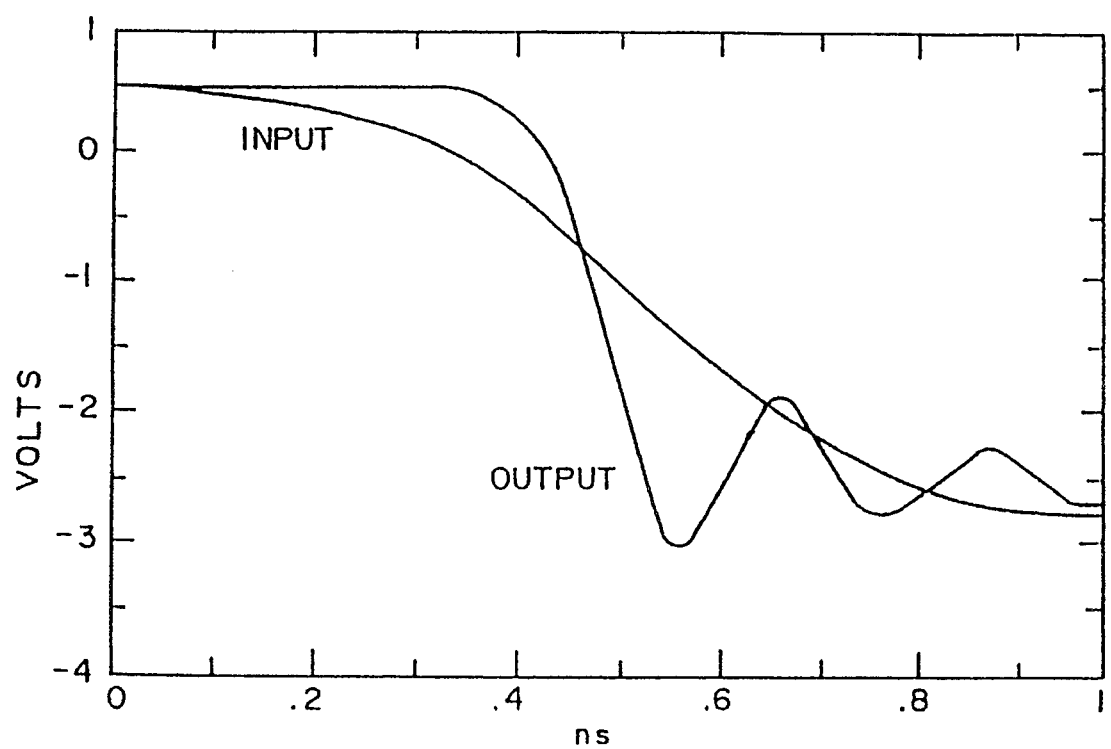
FIG. 17 is a diagram of the relative wave shapes of the input and output signals from the CPW nonlinear transmission line as implemented in a scale model thereof.

FIG. 17 is a graph of the compression of a 500 picosecond input fall time to a 100 picosecond output fall time on a scale model of the nonlinear transmission line which was constructed with very large geometries.

Figure 19:
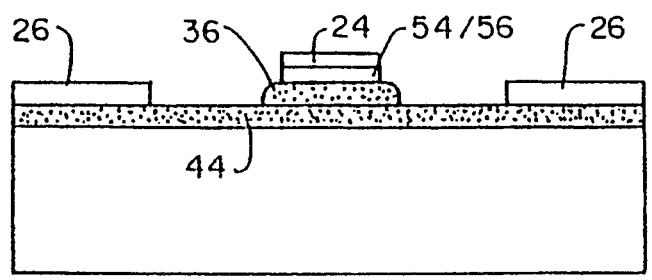
FIG. 19 is a cross-sectional view of another embodiment of the CPW nonlinear transmission line through a region outside the diode isolation island.

FIGS. 18 and 19 show an alternative embodiment. FIG. 18 is a cross-section through one of the diodes of a nonlinear transmission line where the N$^-$ epitaxial layer has been etched away at all locations except the area under the Schottky diode anode contact.

FIG. 19 shows a cross-section through the transmission line at a location other than the location of a diode active area.

Figure 20:
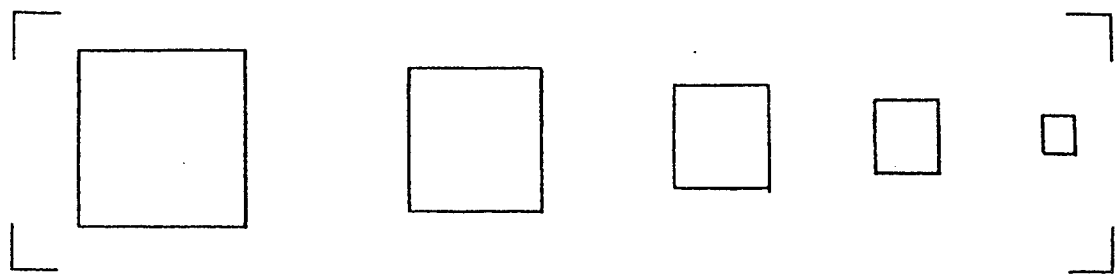
FIG. 20 is a schematic plan view of an embodiment of the CPW nonlinear transmission line wherein the diode junction areas are successively smaller and the spacing between diodes becomes progressively smaller.

FIG. 20 schematically shows another alternative structure. In this structure, the diode junction areas are decreased at each diode location from the input of the line to the output. Further, the spacing between the diodes is scaled in proportion to the decrease in the junction area such that the characteristic impedance of the line remains approximately 50 ohms. The purpose of such an embodiment is to achieve improved performance. This improved performance results from the recognition that as the signal propagates down the line, its fall time is compressed and the high frequency components in the spectrum of the signal therefore increase. These high frequency components change the impedances presented by the capacitances of the diodes and the inductance of the coplanar waveguide sections unless the size of the junction and the spacing between the junctions is altered. FIG. 20 shows the junction areas and junction spacings from plan view only. All other details of the construction are as previously described.

Another possible embodiment is to construct the transmission line in segments, each segment containing a plurality of diodes. In the first segment, the diodes will have a first junction area and a first spacing. In the second segment, the junctions will all be the same size but smaller than the size of junctions in the first section. Further, the spacing between the diodes in the second section will be closer in proportion to the decrease in the junction area so as to maintain the characteristic impedance of that section at approximately 50 ohms. This pattern of ever-decreasing junction area and spacing between the diodes in each section is repeated until the appropriate length for the transmission line is achieved. The first several sections are designed to maximize the change in delay with voltage, thus reducing the total number of diodes required for a given input falltime $T_{f,in}$. The later sections with smaller geometries have higher diode and periodic cutoff frequencies, and are optimized to obtain the shortest possible output falltimes.

Figure 21:
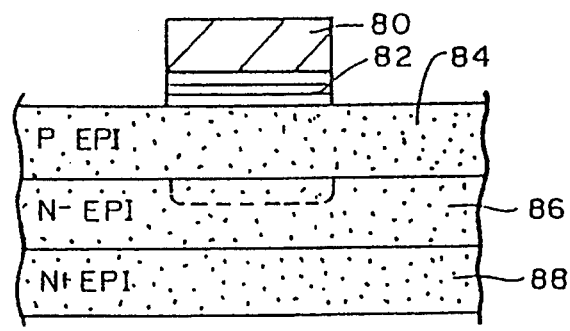
FIG. 21 is a cross-sectional view of the diode region of another embodiment of the nonlinear transmission line.

Other possible structures which can be used to achieve compression according to the teachings of the invention are any capacitance which is voltage dependent. Thus, for example, regular PN diode junctions could be used as opposed to Schottky diodes to create the nonlinearity and voltage-dependent propagation velocity needed to achieve the compression. A cross-section of the diode portion of the transmission in such an embodiment is shown in FIG. 21. In the diode structure of FIG. 21, layer 80 is a gold diode contact. Layer 82 is an ohmic contact. Layer 84 is P type epitaxial gallium arsenide which is doped to give a minimum amount of series resistance in current flow through the P epitaxial layer 84, to the N$^-$ epitaxial layer 86. The N$^-$ epitaxial layer 86 is formed and doped in accordance with the description given above for the epitaxial layer 36. Finally, the N+ epitaxial buried layer 88 is formed and doped in accordance with the description of the N+ epitaxial layer 44 given above. In alternative embodiments, the P type epitaxial layer 84 could be doped P$^-$.

Figure 22:
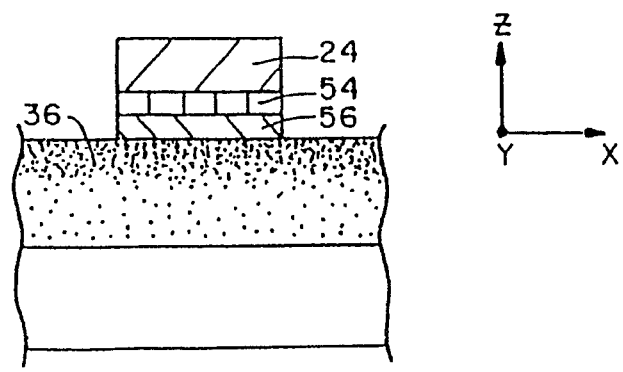
FIG. 22 is a cross-sectional view of the diode region of another embodiment of the nonlinear transmission line.

In yet another alternative embodiment, hyperabrupt Schottky contacts are used to fabricate a line which otherwise has the construction shown in either FIGS. 10 and 12 or FIGS. 18 and 19. Such a hyperabrupt junction is represented by FIG. 22 where the increased density of the dot pattern near the surface of the N$^-$ epitaxial layer represents a heavier doping there. A hyperabrupt Schottky contact requires that the N$^-$ epitaxial layer have a nonuniform doping. Such an N$^-$ layer is lightly doped at the N$^-$/N+ epitaxial layer junction. This doping increases as one moves through the N$^-$ epitaxial layer in the positive Z direction. Such a doping profile can be manufactured using molecular beam epitaxy, liquid phase epitaxy or MOCVD. It is also possible to form such a nonuniform doping profile using ion implantation. In such an embodiment, the N$^-$/N+ epitaxial layers would be formed with molecular beam epitaxy and doped using an ion implantation. The doping profile is adjusted to make the capacitive changes linear for linear changes in the instantaneous line voltage applied to reverse bias the junction. In the preferred embodiment, the change in capacitance for a unit change in reverse bias voltage is nonlinear in that for higher levels of voltage, the unit change in applied reverse bias voltage produces less change in the capacitance than a unit change in voltage at a lower voltage causes. By adjusting the doping profile appropriately, the changes in capacitance for a given change in voltage can be made linear throughout the range of voltages of the input signal. The main reason for using hyperabrupt junctions is to get larger changes in capacitance per unit change in voltage. That is, with a hyperabrupt junction, the capacitance of the resulting junction varies more rapidly with voltage than the capacitance of a junction with uniform doping, producing a greater change in line delay with input voltage. For a given input signal falltime $T_{f,in}$, the required number of diodes and hence the required line length is decreased.

Another alternative embodiment is to reduce the size of the overall die using spiral inductor sections to replace the inductive transmission line sections marked XX in FIG. 12. The spiral inductor sections are publicly known and exist on various devices manufactured by Pacific Monolithics of Sunnyvale, Calif.

Figure 23:
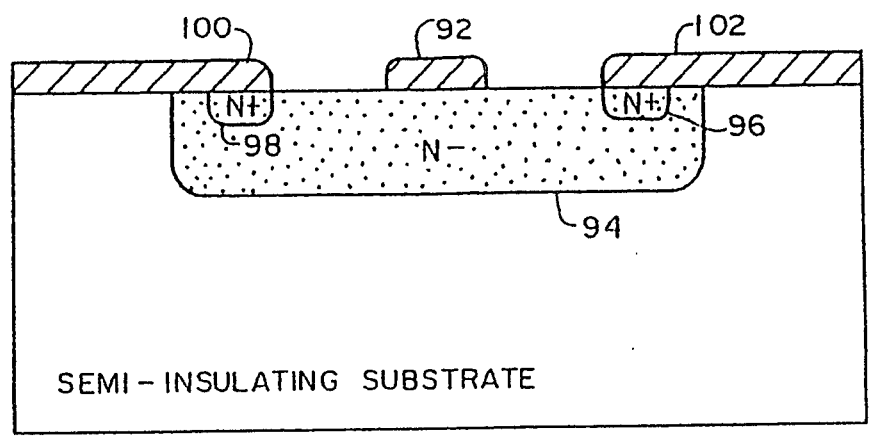
FIG. 23 is a schematic cross-sectional view of another embodiment of the nonlinear transmission line.

Another alternative embodiment which could be used is in the form of a monolithic coplanar wave guide loaded periodically with the gate capacitances of a series of MESFET's. A cross-section through the MESFET of such a device is shown in FIG. 23. In such a device, layer 92 is the gate metal and layer 94 is N⁻ epitaxial gallium arsenide lying on top of a substrate of gallium arsenide (not shown). Layers 96 and 98 are N⁺ epitaxial layers which make contact with source and drain metal contacts 100 and 102.

Figure 24:
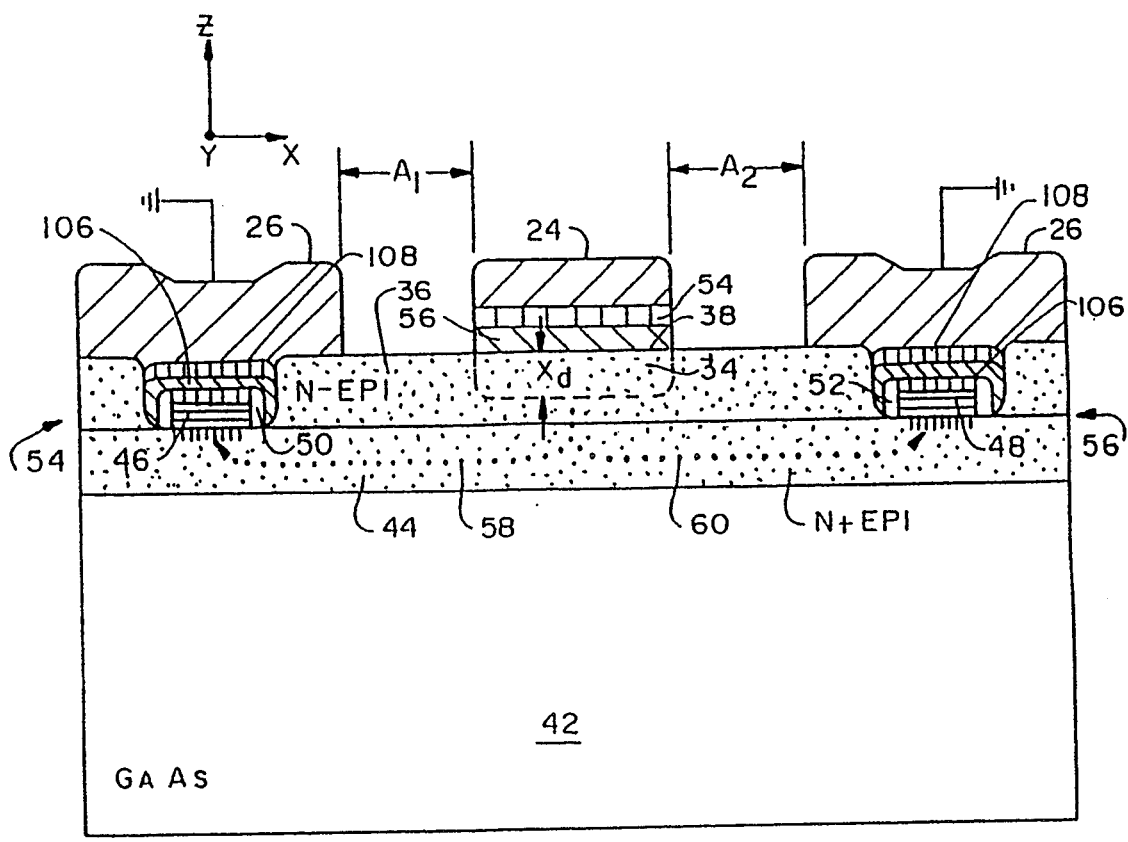
FIG. 24 a cross-sectional diagram of the preferred embodiment of the nonlinear transmission line.

A detailed process schedule for the preferred embodiment of a process according to the teachings of the invention is given in Appendix C. The process schedule of Appendix C results in a structure as shown in FIG. 24. The only difference between the structure of FIG. 24 and that shown in FIG. 10 is the existence of the additional layers of titanium 106 and platinum 108 above the ohmic contact metal. These additional layers do not affect the resistivity of the contacts substantially.

Alternative process technology can also be used to fabricate the device structures described above. Although in the preferred embodiment of the process, a standard NH₄OH/H₂O₂/H₂O gallium arsenide wet etch is used to give good etch depth control needed for etching through the N⁻ layer to the buried N⁺ layer for the ohmic contact and initial alignment marking etch, other etch processes may also be used. For example, dry etch or plasma etch processes may be used if sufficient depth control can be achieved to prevent etching through the N⁺ epitaxial layer. Dry etches create surface states, but it is possible that these surface states can be etched away with a mild wet etch following the dry etch.

In the preferred embodiment, ohmic metallization is a typical germanium-nickel-gold eutectic mixture deposited by electron beam evaporation and alloyed in a rapid thermal annealer. The rapid thermal anneal process is faster, easier, cheaper and more reproducible than a conventional oven anneal process and is therefore preferred. Ohmic contacts of 0.06 ohms/mm resistivity have been achieved which is much lower than the typical values quoted for oven annealed contacts (typically 0.5 to 5 ohm-mm). Although this ohmic contact metallization is achieved using liftoff metallurgy (additive) it is also possible to perform this metallization as well as the other metallizations in the process using subtractive etching processes. Either wet etch or dry etch processes may be used for the subtractive etching. The liftoff technology avoids problems of semiconductor surface etching, and is therefore preferred.

The implant isolation masking is an important step. Since high energy, high dose proton implant masking is required, the preferred embodiment uses a 1.6 micron layer of gold on top of a polyimide layer. This layer is patterned using a thick metal liftoff process. However, this implant mask could also be performed by subtractive processing using either wet or dry etches to define the implant mask. The liftoff process works quite well, and the metal thickness for the gold layer can even be increased to provide better implant masking. Better implant masking permits higher implant energies, which will result in a greater depth of penetration of the implant into the N⁻ layer 36 and the N⁺ semiconductor layers. A thicker N⁺ layer can then be used, reducing the diode series resistance, as is described subsequently. Thicker metal on the implant mask for subtractive processing means longer etch times and possibly lateral etch problems if wet etches or isotropic dry etches are used for subtractive processing. Therefore, liftoff processing is preferred.

Although the final level interconnect metallization requires very thick layers of gold, subtractive etch processing may also be used for this metallization as opposed to the thick metal liftoff process currently used in the preferred embodiment of the process. The thick metal of this metallization is necessary to achieve low line series resistance. This resistance is currently 12 ohms in the preferred embodiment.

As geometries are scaled down to achieve higher performance levels, self-alignment techniques for the fabrication will become more important. Currently, the Schottky diode junction area and the ohmic contacts are formed using self-aligned process steps. In alternative embodiments, the spacing between the central metal conductor 24 and the ground plane conductors 26 may also be performed using self-aligned processes.

Finally, in the preferred embodiment, the N⁺ epitaxial layer 44 is formed at a thickness of 0.8 microns to keep the resistance of the current paths 58 and 60 in FIG. 10 to a minimum. Thicker layers for this epitaxial layer 44 may be used to further lower their resistance. However, for areas outside the diode isolation island, isolation implantation must be performed. Where thicker layers of epitaxial material 44 are used, higher energies for these isolation implants will be necessary. Alternatively, some etch step may be used to remove the epitaxial layers at regions outside the isolation islands. Preferably, this etch step should be self-aligned so as to not destroy the ohmic contacts 46 and 48.

It is also possible to use self-aligned gate techniques to align the Schottky junction area between the ohmic contacts when the dimensions of the structure are scaled to very small geometries. One possibility is to use refractory metal gates in a T shape. The bottom of the T then serves as the Schottky contact while the top of the T serves as an etch mask to define the positions of the inner edges of the contact windows for the ohmic contacts.

COPLANAR STRIP EMBODIMENT OF NONLINEAR TRANSMISSION LINE

Coplanar strip is an equivalent type of integrated transmission line useful for millimeter wavelength applications. The nonlinear transmission line depicted in FIGS. 9, 10 and 12–14 and the alternative embodiments thereof may also be fabricated using coplanar strip.

Coplanar strip transmission line uses only two conductors integrated on a substrate. To fabricate a nonlinear transmission line useful for pulse fall time compression, two conductors are fabricated on top of a lightly doped epitaxially grown layer formed on top of a heavily doped epitaxially grown buried layer in a semiconductor substrate. Isolation islands for varactor diodes are then formed along the length of the coplanar strip transmission line by ion implantation. Varactor diodes are then fabricated in the isolation islands to load the transmission line at various points with junction capacitances that vary in capacitance with the voltage across the transmission line. The coplanar strip transmission line is fabricated with dimensions so as to have a characteristic impedance (without the presence of the diodes) which is greater than a desired characteristic impedance. The varactor diodes then add capacitance to the line to bring the overall characteristic impedance down to the desired level. Typically this desired level is 50 ohms, but it need not be. For example, the final characteristic impedance could be set at, say, 75 ohms for use internally in an instrument such as an oscilloscope, with 50 ohm impedance matching sections at the input and/or output to interface with industry standard 50 ohm circuits to which the instrument may be connected.

Figure 25:
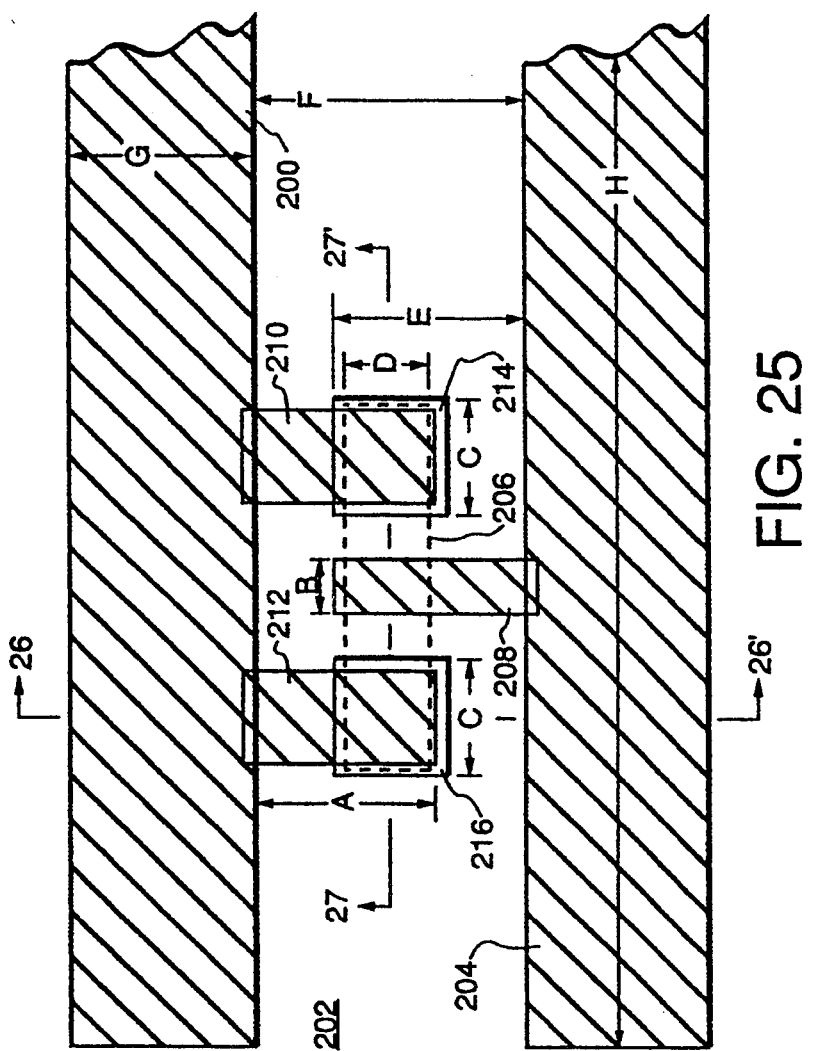
FIG. 25 is a plan view of one segment of an integrated CPS nonlinear transmission line.

Referring to FIG. 25, there is shown the preferred embodiment in plan view of one section of a coplanar strip nonlinear transmission line. Of course a coplanar nonlinear transmission line will be comprised of many such sections cascaded in series. Typically 100 sections such as are shown in FIG. 25 will be cascaded. Such an arrangement of 100 cascaded sections like that shown in FIG. 25 can provide compression of a 100 picosecond fall time to a fall time on the order of 3.5 picoseconds.

In FIG. 25, conductor 200 represents one of the two integrated conductors on the surface of the substrate 202 that forms the coplanar strip transmission line. Conductor 204 represents the other conductor of the coplanar strip transmission line. Dashed line 206 represents the outline of the active area for the varactor diode for the transmission line section shown in FIG. 25. All areas of the substrate outside the active area 206 are rendered nonconductive by ion implantation damage so as to create an isolation island for the diode.

A Schottky anode contact 208 for the varactor diode in the form of an extension of the metal of the coplanar strip conductor 204 extends out and away from the coplanar strip conductor 204 and over the diode active area 206. The Schottky diode anode contact 208 is fabricated of the same material and in the same manner as previously described herein. In the preferred embodiment, the anode contact metal 208 is comprised of gold lying over a titanium Schottky metal anode contact in contact with the substrate. A platinum diffusion barrier separates the gold of the conductor 208 from the underlying platinum Schottky metal. Any metal that will form a Schottky diode may be used in contact with the substrate.

Two cathode contacts 210 and 212 for the varactor diode are formed by extending the metal of the conductor 200 of the coplanar strip transmission line over two ohmic contacts 214 and 216 aligned over opposite ends of the diode active area. The ohmic contacts 214 and 216 are formed in the manner described above using the same ohmic contact alloy. As noted above, any ohmic contact alloy will work, but it is preferred to use an alloy that will create the lowest possible contact resistance. The metal of the cathode contacts 210 and 212 is gold as is the metal of the anode contact 208 and the coplanar strip contacts 200 and 204.

The various dimensions of the coplanar strip nonlinear transmission line element shown in FIG. 25 are marked by letters A through H. These dimensions are given below for the preferred embodiment having an overall the quantity equal to the characteristic impedance of the 50 ohms. Other dimensions may be selected for other desired impedance levels. The overall characteristic impedance of the transmission line is equal to the square root of per section transmission line induction divided by the per section capacitance. The per section capacitance is the combination of the voltage dependent diode junction capacitance and the parasitic capacitance of the transmission line itself. The overall characteristic impedance of the nonlinear transmission line can be raised by increasing the per section impedance by moving the two conductors 200 and 204 further apart. Generally, it is desirable to maintain as high a level as possible for the diode junction capacitance since it is this capacitance which causes the pulse fall time compression. Therefore, moving the conductors 200 and 204 further apart allows more diode junction capacitance to be used without increasing the characteristic impedance above the desired level. Generally, the desired level for this characteristic impedance is 50 ohms since this is an industry standard. The dimensions that follow are for a 50 ohm coplanar strip nonlinear transmission line: A=whatever dimension is needed for the cathode contact to reach from the edge of the coplanar strip conductor 200 to the far edge of the isolation island 206 where the isolation island is 19 microns in width and is centered between the conductors 200 and 204 of the coplanar strip; B=5 microns; C=10 microns; D=19 microns; E=23 microns; F=26 microns; G=20 microns; and H=166 microns. In FIG. 25, the boundaries of the cathode contacts, ohmic contacts and active areas are not shown coincident for clarity of explanation. In an actual device, the actual boundaries may be coincident, but generally the ohmic contact is made bigger than the cathode contact strip. The important thing is that good contact be made to minimize the diode series resistance. The dimensions given above result in a characteristic impedance for the coplanar strip transmission line (absent the diodes) of approximately 100 ohms. When the diodes are added to load the transmission line, the characteristic impedance is brought down to approximately 50 ohms.

Further, in the preferred embodiment, two different sizes of coplanar strip nonlinear transmission line cells or segments are used. This is because a higher bandwidth for the segments nearest the far end of the nonlinear transmission line is desirable since the signals propagating along the line at the far end have had their fall times compressed and consequently have greater bandwidth. The exact point along the line at which to switch from the larger size cells to the smaller size cells is not known exactly but can be experimentally determined as that point where maximum compression occurs. The point is thought to lie somewhere between 60 and 70 diodes from the input end of the coplanar strip nonlinear transmission line input.

The dimensions for the smaller size cells used near the output end of the coplanar strip nonlinear transmission line are: A=17.5 microns; B=5 microns; C=10 microns; D=9.5 microns; E=18 microns; F=25 microns; G=20 microns; and H=83 microns. These smaller size cells are slightly more lossy than the larger cells, but have twice as high a periodic cutoff frequency (the cutoff frequency related to the product of the series inductance of the transmission line times the total capacitance of the waveguide and the diodes) because the junction area of the diode junction is smaller thereby making the junction capacitance smaller. Thus the impedance of the junction capacitance presented to the higher frequency fourier components near the output end of the coplanar strip nonlinear transmission line is higher thereby yielding a higher cutoff frequency. Of course, in many embodiments, the maximization of performance obtained by changing cell sizes near the end of the transmission line is not necessary, and the same size cells may be used throughout the length of the line.

The dimensions given above are of course not the only dimensions which can be used. Many other combinations of dimensions exist which will still yield a device of acceptable performance characteristics for many different applications. Of course, the application itself and the frequency range of interest and the desired compression levels also play a part the dimensions selected.

Figure 26:
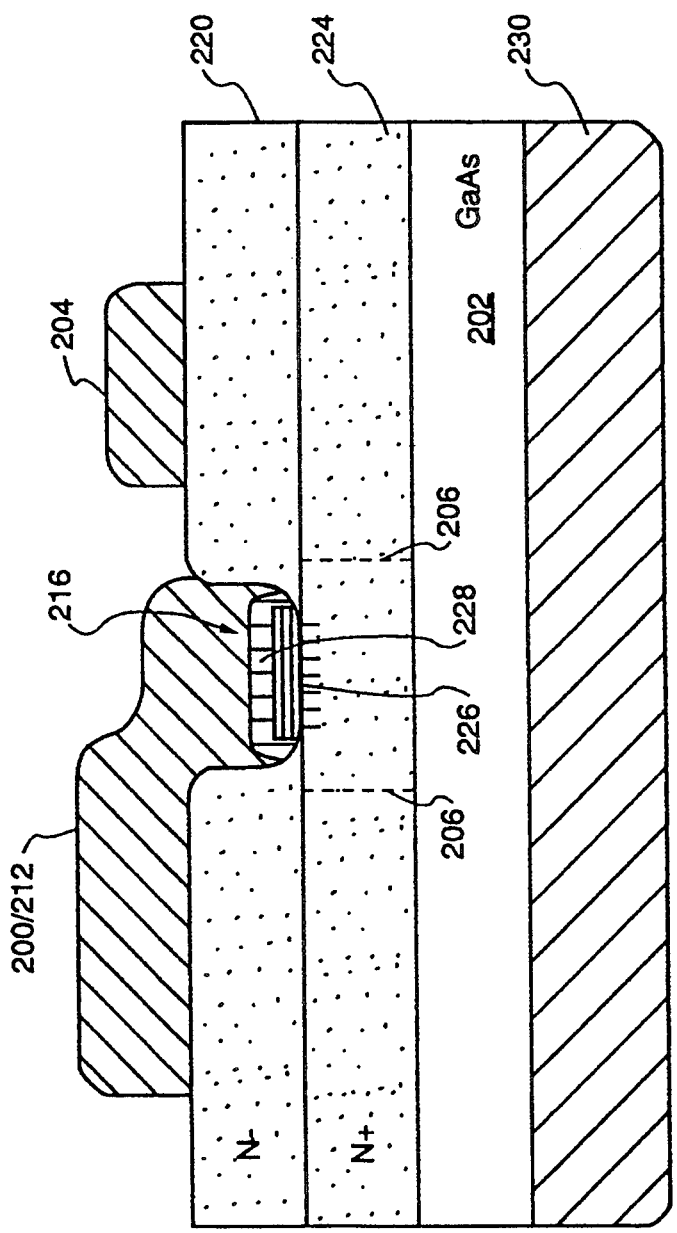
FIG. 26 is a cross-sectional view through the cathode contact and active area of a Schottky barrier varactor diode of a CPS nonlinear transmission line.

Referring to FIG. 26, there is shown a cross-sectional view of the coplanar strip nonlinear transmission line segment of FIG. 25 taken along section line 26—26' in FIG. 25. The view of FIG. 26 basically shows a section through the ohmic cathode contact. The metal of the coplanar strip conductor 200 and the extension forming the cathode contact 212 lies atop an N— doped epitaxially grown layer 220 of gallium arsenide on the gallium arsenide substrate 202. The N— epitaxial layer 220 lies atop a heavily doped N+ buried layer 224 of epitaxially grown gallium arsenide. The ohmic contact 216 is formed using the self aligned process given in Appendix A for mask level 1 processing. Basically, the N— epitaxial layer 220 is etched to expose the N+ buried layer and ohmic contact alloy is evaporated and lifted off using the same photoresist used as the etch mask. The various metals and thicknesses used are given in Appendix A, but any low resistance ohmic contact can be used. The ohmic contact 216 is shown symbolically in FIG. 26 as including a layer 226 of ohmic alloy and a diffusion barrier 228. After the evaporation steps and liftoff, the ohmic alloy is alloyed at 450 degrees centigrade to cause the ohmic alloy metals to make good electrical contact with the buried layer 224 as symbolized by the vertical lines extending into the buried layer 224 from the ohmic metal layer 226. The doping of the buried layer 224 should be as heavy as possible to keep the series resistance of the diode as low as possible. In the preferred embodiment, the N+ buried layer is doped to $3 \times 10^{18}$ atoms/cm$^3$.

The other conductor 204 of the coplanar strip lies on top of the N— doped epitaxially grown layer as shown.

Coplanar strip transmission line, having two conductors, has only two modes of propagation. The unbalanced mode is where both conductors have the same voltage and the same polarity at all points along the line. The balanced mode is where the two conductors have opposite polarity and the same voltage all along the line. Not much loss is suffered in the balanced mode because the electric field lines only go from one conductor to the other and do not extend very far into space. This is the desired mode since it is the lowest loss mode of propagation. The unbalanced mode is an undesirable mode however because the electric field lines from the two conductors are additive and extend far into the surrounding space looking for a ground plane. When this occurs, losses are experienced. To suppress this mode of propagation, a lossy material 230 may be placed beneath the substrate or surrounding the substrate 202. This lossy material may be silicone rubber with ferrite particles embedded therein. In some embodiments, the lossy material layer 230 may be comprised of two layers: a first layer of conductive foam, and a second layer of lossy material such as the silicone rubber with embedded ferrite particles. Another acceptable lossy material is called Polyiron ™ (marketed by Emerson & Cuming) which is a ceramic material loaded with ferrite. Use of this lossy material is important in any application where a ground plane is to be located near the integrated coplanar strip nonlinear transmission line. If a ground plane is to be located nearby, the lossy material should be placed between the integrated coplanar strip nonlinear transmission line and the ground plane. Any structure to do this will suffice. In practical embodiments, the presence of this lossy material is almost always necessary because the housing used to protect the device and shield the external world is usually metal and constitutes a ground plane. Because the coplanar strip nonlinear transmission line constitutes so many segments, it is generally wound into a serpentine arrangement to keep the package size small. The corners of this serpentine structure and any other changes in the transmission line act as discontinuities to couple all the higher and lower order modes of propagation. Without the presence of the lossy material, each discontinuity can feed power into the unbalanced mode and cause undesirable losses. It is common practice to place the lossy material beneath the substrate.

Figure 27:
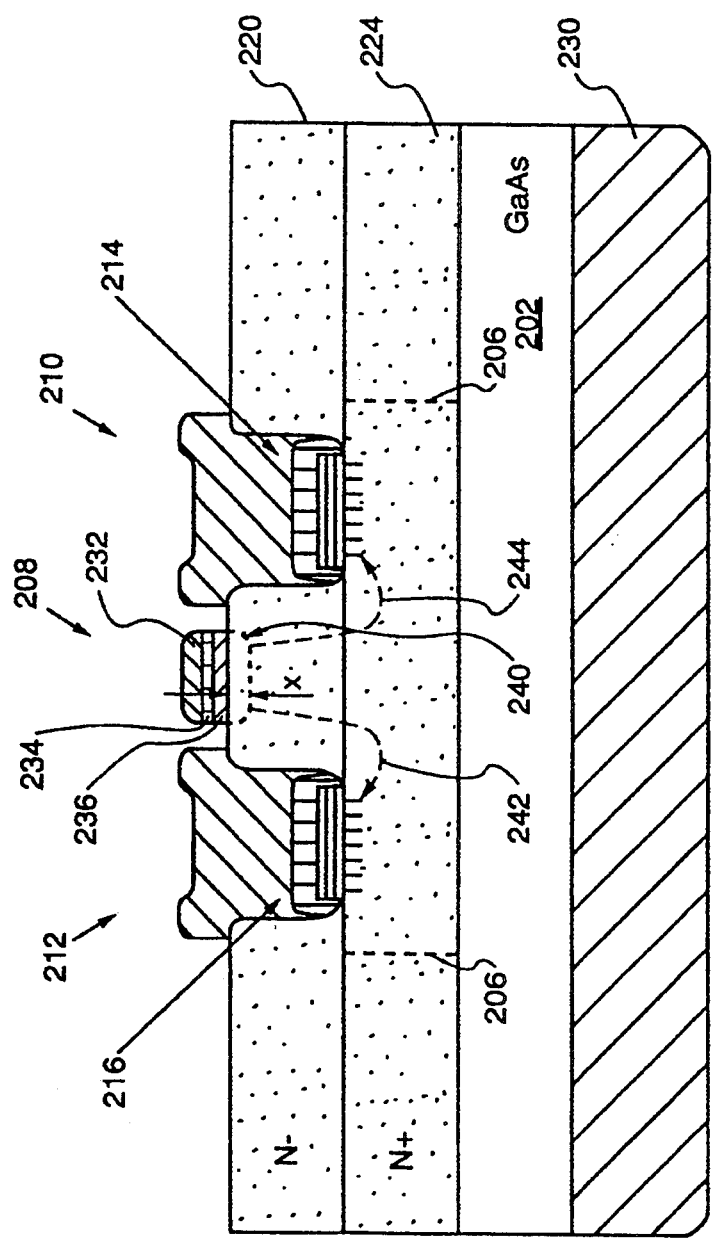
FIG. 27 is a cross-sectional view through both anode and cathode contacts of the Schottky barrier varactor diodes of the nonlinear transmission line.

Referring to FIG. 27, there is shown a cross-sectional view of the coplanar strip nonlinear transmission line taken through the active area of diode area along section line 27—27' in FIG. 25. Dashed lines 206 in FIGS. 26 and 27 outline the extent of the active area. The metal of the cathode contacts 212 and 210 overlie ohmic contacts 214 and 216. The metal of the anode contact 208 is comprised of gold layer overlying diffusion barrier 234 which overlies Schottky metal 236. The distance between the anode contact 208 and each of the cathode contacts 210 and 212 is the minimum distance allowed under the design rules used to fabricate the structure so as to minimize the series resistance of the diode. It is important to keep the diode series resistance small and the structure compact so as to keep parasitic capacitance and inductance from adversely affecting the diode cutoff frequency. If the diode cutoff frequency is not kept high, the cutoff frequency can limit the smallest pulse width or edge transition which can be faithfully propagated down the line. The presence of the heavily doped buried layer 224 coupled with the use of the smallest possible distance between the anode and cathode contacts helps keep the series resistance of the diode down. Another factor which helps to keep the series resistance down is to optimize the depth of the N— layer 220 so as to be approximately as thick as the maximum depth of penetration of the depletion layer 240 under the anode contact. This minimizes the length of the portion of the current paths 242 and 244 which lie in the lightly doped N— epitaxial layer 220. The use of Schottky contacts for the anode and ohmic contacts for the cathode also help to decrease the series resistance of the diode. Also, the use of isolated islands for the diodes as opposed to continuous junctions reduces the capacitance per unit length of the transmission line. If a continuous junction were used, the value of the capacitance per unit length would be so high as to render it impossible to achieve a characteristic impedance for the nonlinear transmission line greater than a few ohms. This would cause massive attenuation and reflection of power at the input to such a nonlinear transmission line because of the gross impedance mismatch between the outside world at 50 ohms and the continuous junction nonlinear transmission line operating at a characteristic impedance of only a few ohms.

Figure 28:
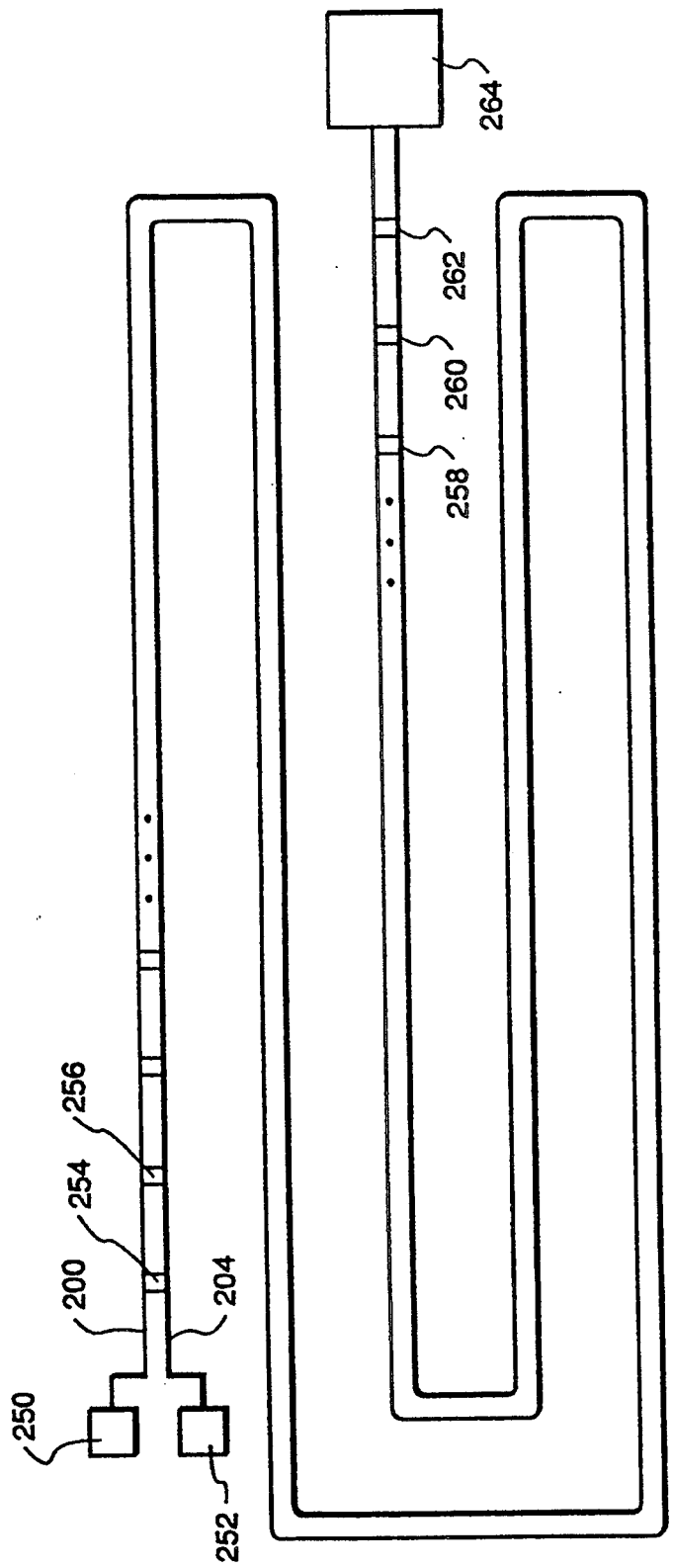
FIG. 28 is a plan view of the serpentine structure of a CPS nonlinear transmission line showing the use of both larger and smaller cells in the same line.

Referring to FIG. 28, there is shown a plan view of the coplanar strip nonlinear transmission line using two different size segments. The input consists of contact pads 250 and 252 each of which is coupled to one of the conductors 200 and 204. The first varactor diode segment 254 has the structure shown in FIGS. 25 through 27. The second diode segment 256 has the same structure as the diode segment 254. The center-to-center spacing of the diode segments 254 and 256 is 166 microns in the preferred embodiment. This structure is repeated for 60 to 90 diode cells, and probably somewhere between 60 and 70 diodes. The last 10 or so diode segments have the smaller junction area and segment length given above. Diode segments 258, 260 and 262 are typical of these smaller cells with higher cutoff frequency. Each of the smaller diode segments also has the structure shown in FIGS. 25 through 27 except with the smaller dimensions.

Box 264 represents the output of the coplanar strip nonlinear transmission line, and may be a sampler structure to be described next.

Figure 29:
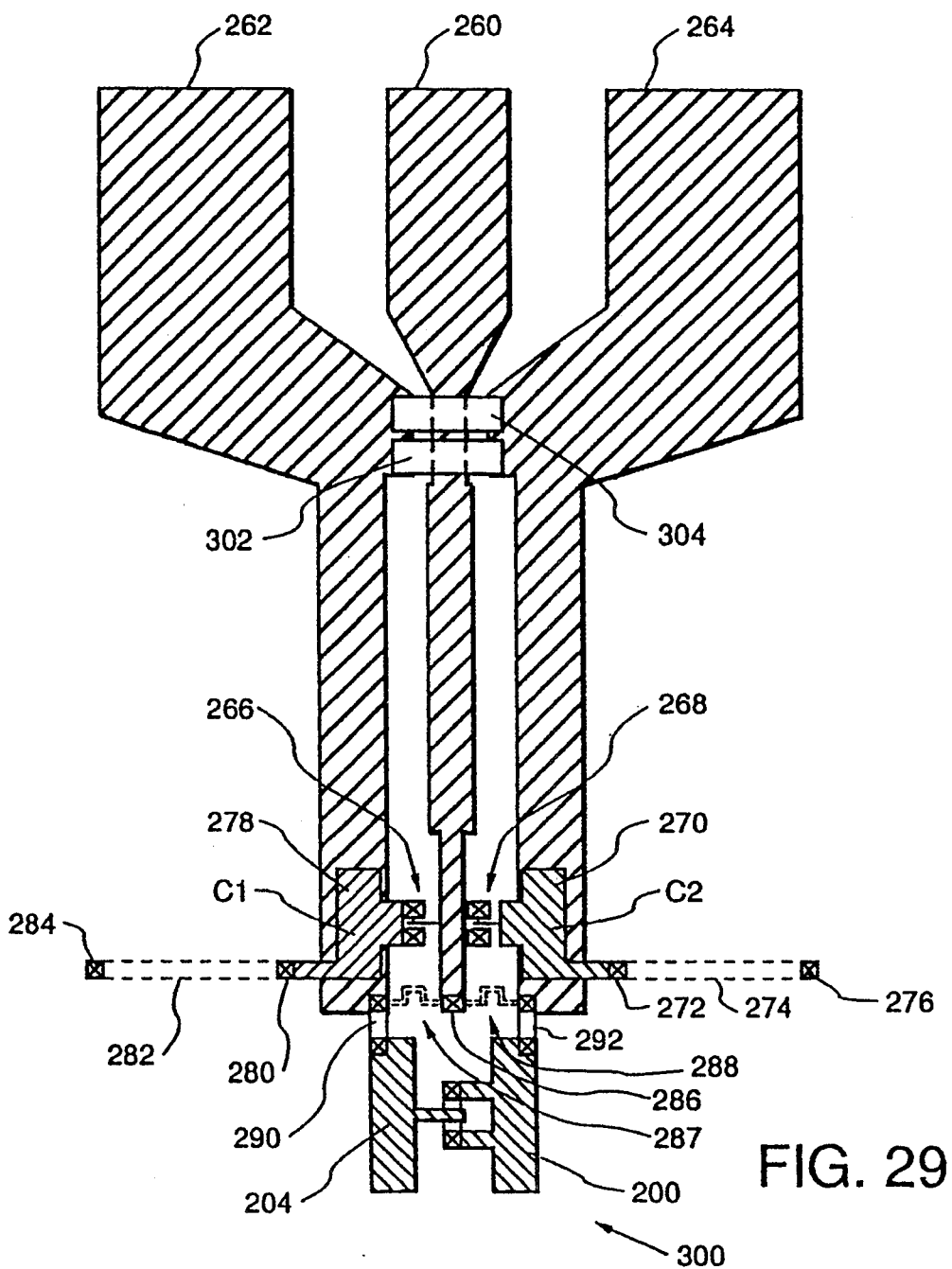
FIG. 29 is a plan view of an equivalent time sampler using CPS nonlinear transmission line for sample pulse generation.

Referring to FIG. 29, there is shown a plan view of a sampler structure for equivalent time sampling using a coplanar strip nonlinear transmission line to compress the local oscillator pulses. Radio frequency signals to be sampled are coupled into the center conductor 260 and ground plane conductors 262 and 264 of a coplanar waveguide transmission line. The center conductor 260 is coupled to the anode of a sampling diode 266 and to the cathode of a sampling diode 268 by two ohmic contacts shown in FIG. 29 as two boxes with x's therein. The two sampling diodes 266 and 268 have the same structure as the diode structure shown in FIGS. 25 through 27. That is, there is an isolated island in a buried layer under each of the anode contacts which are shown as single lines extending between the boxes representing the ohmic contacts. The anode of diode 266 extends left from the center conductor 260 and the anode of diode 268 extends left from the metal of the top plate 270 of a capacitor C2 comprised of top plate 270 and the ground plane conductor 264. The capacitor C2 in FIG. 29 has the same circuit connections and the same function as the capacitor C2 in FIG. 1. The top plate 270 of the capacitor C2 is also coupled via an air bridge and an ohmic contact 272 and a buried layer resistor 274 to an intermediate frequency output port 276 which is an ohmic contact to the buried layer resistor. The resistor 274 is a conductive path through the buried layer surrounded by a field of ion implant damage and is fabricated by masking off a portion of the buried layer (not shown) during the ion implantation for isolation of the diode islands.

The top plate 270 of the capacitor C2 is separated from the ground plane conductor 264 by a layer of insulating material such as nitride.

The cathode of the diode 266 is coupled by two ohmic contacts to the top plate 278 of a capacitor C1. The bottom plate of this capacitor is ground plane conductor 262 and is separated from the top plate 278 by a layer of nitride. The top plate 278 of capacitor C1 is also coupled by an air bridge and an ohmic contact 280 and a buried layer resistor 282 to another intermediate frequency output 284.

The resistors 282 and 274 are each 500 ohms in the preferred embodiment and serve to provide isolation between the RF and IF circuits.

The center conductor 260 of the coplanar waveguide transmission line is coupled by an ohmic contact 287 to one end of each of two 100 ohm buried layer resistors 286 and 288. Each of these buried layer resistors connects the center conductor 260 to one of the two ground plane conductors 262 or 264. The paths of these serpentine buried layer resistors 286 and 288 are shown by dashed lines as are the paths of the other buried layer resistors in the sampler structure. The two 100 ohm buried layer resistors 286 and 288 are seen by the RF signal coplanar waveguide transmission line as a single 50 ohm termination.

Each of the ground plane conductors 262 and 264 are coupled by 20 ohm buried layer resistors 290 and 292, respectively, to the two conductors 204 and 200, respectively, of a coplanar strip nonlinear transmission line 300 of which only the last diode segment is shown. The purpose of the coplanar strip nonlinear transmission line 300 is to receive local oscillator strobe pulses and compress the fall times thereof for use in sampling the RF. The sampling pulses arriving from the nonlinear transmission line 300 turn on the sampling diodes 266 and 268 momentarily as they propagate past these diodes. The sampling pulses continue to propagate up the ground plane conductors 262 and 264 until they encounter a short therebetween caused by air bridges 302 and 304. At this short, the sampling pulses are reflected and propagate back toward the sampling diodes 262 and 264. When the sampling pulses again arrive at the sampling diodes 266 and 268, these diodes are turned off and the sample is complete. The manner in which the sampling bridge derives the intermediate frequency output signal has been described earlier herein and this discussion generally applies to the embodiment of FIG. 29 and will not be repeated here. The details of the structure of the sampling diodes, capacitors, air bridges and buried layer resistors are also described above in connection with the discussion of FIGS. 5, 6 and 7 and will not be repeated here.

The best mode of fabricating the nonlinear transmission lines disclosed herein is through use of a hyperabrupt doping profile using the process detailed in Appendix D. This appendix is a complete process specification which includes all the steps necessary to fabricate the structures disclosed herein including the hyperabrupt doping profile. A description of hyperabrupt-doped coplanar waveguide nonlinear transmission lines is found in Madden et al., "Hyperabrupt-doped GaAs Nonlinear Transmission Line for Picosecond Shock Wave Generation", Apple. Phys. Left 54 (11) Mar. 13, 1989 and Madden et al., "Generation of 3.5 ps Fall-Time Shock Waves on a Monolithic Gabs Nonlinear Transmission Line", A Electron Device Letters, Vol 9, No. 6 (June 1988) both of which papers are hereby incorporated by reference. Hyperabrupt doping provides the same fall time compression in half the length thereby decreasing the insertion loss. For a periodic line cutoff frequency of 500 GHz and a diode cutoff frequency of 3.8 THz, surface doping of $3.3 \times 10^{17}/cm^3$ and exponential doping decay constant of 0.175 microns (See the equation for doping profile above Equation 3 of the Madden et al. paper in Applied Physics Letters) and a junction capacitance of 20 femptofarads may be used.

The advantages of using coplanar strip for a nonlinear transmission line are several. First, for a given level of impedance per unit length, coplanar strip is more compact than coplanar waveguide. The reason for this is that to get a sufficiently high impedance of around 90 to 100 ohms for the transmission line absent the diodes, in coplanar waveguide (CPW) the ground plane conductors must be spread out very far from the center conductor. The reason for this is that to keep the series resistance of the center conductor of the coplanar waveguide down to tolerable levels, the center conductor must be made at least a few microns wide. Because the characteristic impedance of the transmission line depends upon the ratio of the width of the center conductor to the separation between the groundplanes, the separation between the groundplanes must be quite large to achieve a 90 to 100 ohm characteristic impedance for the CPW line absent the diodes. This high level of impedance is necessary so that when the diodes are added, the predominantly capacitive reactance added thereby creates an overall characteristic impedance for the periodically loaded CPW transmission line of approximately 50 ohms. Because of the structure of coplanar strip (CPS) transmission line, a high level of impedance of 100 ohms (absent the diodes) can easily be achieved with two conductors 20 microns wide and 26 microns apart. This is a much smaller structure than a CPW line of the same impedance.

Smaller integrated structures have two alternative advantages: 1) more circuitry can be put on the same size die, or 2) a smaller die can be used for the same amount of circuitry thereby increasing production yield.

A second advantage of a CPS nonlinear transmission line over a CPW nonlinear transmission line is lower insertion loss. In CPW, the center conductor width must be made fairly narrow to prevent the need to put the ground plane conductors extremely far away to achieve an acceptably high level of impedance. If 90–100 ohms characteristic impedance before the diodes are added is not achieved, the overall characteristic impedance of the CPW line after the diodes are added will be substantially below 50 ohms. This will cause very serious loss of efficiency in coupling such a line to a 50 ohm source since very little power will be coupled into the line and substantially all the power will be reflected back into the source.

This need to keep the center conductor width relatively small, inherently causes the series resistance of CPW transmission line to be higher than CPS transmission line of the same characteristic impedance. This higher series resistance for CPW versus CPS means that higher insertion loss will be suffered using 50 ohm CPW than for 50 ohm CPS.

What is claimed is:

1. A sampler circuit comprising:
   means for providing a signal from a local oscillator;
   means for generating shock waves coupled to said means for providing a local oscillator signal, said means for generating shock waves including a nonlinear transmission line spanned by a plurality of varactors;
   means for sampling an input signal coupled to said means for generating shock waves, said means for sampling including:
   a pair of sampling capacitors coupled to said pair of sampling diodes and an intermediate frequency output network that includes a positive terminal and a grounded terminal which together produce an intermediate frequency sampled output.

2. The apparatus of claim 1 wherein said integrated nonlinear transmission line is comprised of a periodically loaded coplanar waveguide integrated on a gallium arsenide substrate.

3. The apparatus of claim 1 wherein said varactor diodes are hyperabrupt varactor diodes.

4. The apparatus of claim 3 wherein said hyperabrupt varactor diodes are comprised of Schottky hyperabrupt varactor diodes.

5. The apparatus of claim 2 wherein said means for providing a signal is a local oscillator integrated on said substrate for generating a sine wave signal coupled to said input port.

6. The apparatus of claim 2 wherein said means for providing a signal is a pulse generator integrated on said substrate for generating a pulse train comprised of a plurality of sampling pulses coupled so as to propagate down said means for generating shock waves.

7. The apparatus of claim 1 further comprising a substrate of gallium arsenide semiconductor and wherein said means for generating shock waves and said means for sampling an input signal are integrated on said substrate and further comprising a transmission line integrated on said substrate and coupling said signal to be sampled to said sampling capacitors and said sampling diodes.

8. The apparatus of claim 7 wherein said pulse generator is integrated on said substrate.

9. The apparatus of claim 6 wherein said local oscillator is integrated on said substrate.

* * * * *